(12) United States Patent
Lavery et al.

(10) Patent No.: US 12,336,118 B1
(45) Date of Patent: Jun. 17, 2025

(54) PLANAR INDUCTIVE APPARATUS AND METHOD

(71) Applicant: Vicor Corporation, Andover, MA (US)

(72) Inventors: Patrick R. Lavery, North Andover, MA (US); Jeffrey John LeBlanc, Grafton, MA (US); Patrizio Vinciarelli, Boston, MA (US)

(73) Assignee: Vicor Corporation, Andover, MA (US)

( * ) Notice: Subject to any disclaimer, the term of this patent is extended or adjusted under 35 U.S.C. 154(b) by 158 days.

(21) Appl. No.: 16/878,263

(22) Filed: May 19, 2020

(51) Int. Cl.
  *H05K 3/44* (2006.01)
  *H01F 27/30* (2006.01)
  *H01F 41/02* (2006.01)

(52) U.S. Cl.
  CPC ............ *H05K 3/44* (2013.01); *H01F 27/306* (2013.01); *H01F 41/0246* (2013.01)

(58) Field of Classification Search
  CPC ..... H01F 2027/2819; H01F 2027/2809; H01F 27/2804; H01F 41/041–045; H01F 41/046; H05K 2201/086; H05K 1/165
  See application file for complete search history.

(56) References Cited

U.S. PATENT DOCUMENTS

| | | | |
|---|---|---|---|
| 3,102,213 A | 8/1963 | Bedson et al. | |
| 3,426,305 A | 2/1969 | Keble | |
| 4,471,271 A | 9/1984 | Wendt | |
| 5,146,198 A | 9/1992 | Pollard et al. | |
| 5,214,392 A | 5/1993 | Kobayashi | |
| 5,239,744 A | 8/1993 | Fleming et al. | |
| 5,353,001 A | 10/1994 | Meinel et al. | |
| 5,400,006 A | 3/1995 | Cardozo | |

(Continued)

FOREIGN PATENT DOCUMENTS

DE 2800750 12/1979

OTHER PUBLICATIONS

Caillaud et al., "High power PCB-embedded inductors based on ferrite powder", MiNaPAD Forum, 2017, 44 pages.
(Continued)

*Primary Examiner* — Livius R. Cazan
(74) *Attorney, Agent, or Firm* — Fish & Richardson P.C.

(57) ABSTRACT

An inductive device with flux paths through a substrate may be made by depositing a malleable magnetically permeable material into a hole in the substrate and curing the malleable magnetically permeable material to form a substantially solid magnetic plug. Deposition of the malleable magnetically permeable material may comprise stencil-printing followed by use of a flexible runner. A uniform extension of the plug above an outer surface of the substrate may be provided by a spacer on the outer surface. The spacer may, e.g., be a conductive layer and/or a non-conductive material on the surface. Magnetic plates spanning two or more plugs may form a closed magnetic flux path. A plug may be surrounded by a winding on a layer of the substrate. Extension of the plug above an outer surface of the substrate may ensure the integrity of an essentially gap-free connection between the end of the magnetic plug and a mating surfaces of a magnetic plate. The plug may be reduced for co-planarity with the substrate surface, or to form a recess below the substrate surface, e.g. to form controlled gaps in the permeable medium.

100 Claims, 27 Drawing Sheets

(56) References Cited

U.S. PATENT DOCUMENTS

| | | | |
|---|---|---|---|
| 5,598,327 A | 1/1997 | Somerville et al. | |
| 5,787,569 A | 8/1998 | Lofti et al. | |
| 6,138,344 A | 10/2000 | Roessler et al. | |
| 6,792,667 B2 | 9/2004 | Roy et al. | |
| 6,808,642 B2 * | 10/2004 | Takaya | H01G 4/308 |
| | | | 29/829 |
| 6,911,848 B2 | 6/2005 | Vinciarelli | |
| 6,930,893 B2 | 8/2005 | Vinciarelli | |
| 6,975,098 B2 | 12/2005 | Vinciarelli | |
| 6,984,965 B2 | 6/2006 | Vinciarelli | |
| 7,145,786 B2 | 12/2006 | Vinciarelli | |
| 7,187,263 B2 | 3/2007 | Vinciarelli | |
| 7,209,026 B2 | 4/2007 | Frutschy et al. | |
| 7,280,026 B2 | 10/2007 | Chandrasekaran et al. | |
| 7,295,094 B2 | 11/2007 | Jitaru et al. | |
| 7,796,615 B2 | 9/2010 | Ochi et al. | |
| 8,203,418 B2 | 6/2012 | Harrison | |
| 8,277,678 B2 | 10/2012 | Cheng et al. | |
| 8,369,100 B2 | 2/2013 | Azuma | |
| 8,395,472 B2 | 3/2013 | Roozeboom et al. | |
| 9,112,422 B1 | 8/2015 | Vinciarelli | |
| 9,166,481 B1 | 10/2015 | Vinciarelli et al. | |
| 9,190,206 B1 | 11/2015 | Luzanov | |
| 10,128,764 B1 * | 11/2018 | Vinciarelli | H02M 3/33592 |
| 10,454,380 B1 | 10/2019 | Vinciarelli | |
| 10,468,181 B1 | 11/2019 | Vinciarelli | |
| 10,537,015 B1 | 1/2020 | Vinciarelli et al. | |
| 10,651,744 B1 | 5/2020 | Vinciarelli et al. | |
| 10,938,311 B1 | 3/2021 | Vinciarelli | |
| 11,264,911 B1 | 3/2022 | Vinciarelli | |
| 2001/0054946 A1 | 12/2001 | Inoue | |
| 2005/0110606 A1 | 5/2005 | Vinciarelli | |
| 2005/0174207 A1 | 8/2005 | Young | |
| 2005/0266730 A1 | 12/2005 | Lanni | |
| 2005/0282309 A1 * | 12/2005 | Cheng | H05K 1/167 |
| | | | 438/106 |
| 2005/0285253 A1 | 12/2005 | Takashi | |
| 2006/0006975 A1 | 1/2006 | Jitaru et al. | |
| 2006/0154052 A1 | 7/2006 | Waffenschmidt et al. | |
| 2010/0295646 A1 | 11/2010 | Harrison et al. | |
| 2012/0133469 A1 | 5/2012 | Tomonari et al. | |
| 2012/0194314 A1 | 8/2012 | Mo | |
| 2013/0097857 A1 * | 4/2013 | Himori | H01B 1/12 |
| | | | 29/853 |
| 2013/0119908 A1 | 5/2013 | Harada | |
| 2015/0116950 A1 * | 4/2015 | Yoo | H01F 27/2804 |
| | | | 361/728 |
| 2019/0287815 A1 * | 9/2019 | Xu | H01F 41/24 |

OTHER PUBLICATIONS

U.S. Appl. No. 14/731,287, filed Jun. 4, 2015, Vinciarelli.
U.S. Appl. No. 14/822,561, filed Aug. 10, 2015, Vinciarelli.
U.S. Appl. No. 14/874,054, filed Oct. 2, 2015, Vinciarelli.
Polyakov et al., "Dependence of the magnetic permeability of ferromagnetic powder materials on particle size," Powder Metallurgy and Metal Ceramics, 1994, 33(1-2):9-10.
Soupremanien et al., "Soft Ferrite Material by Powder Injection Molding Process for Power Electronics," IEEE Transactions on Magnetics, Dec. 2020, 56(12):1-7.

* cited by examiner

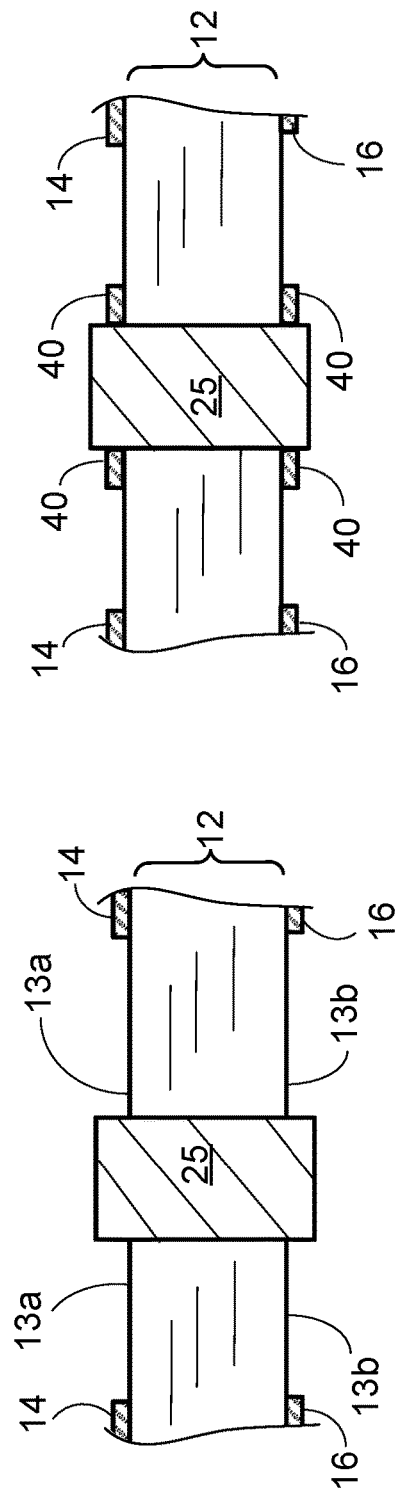
FIG. 22A
FIG. 22B
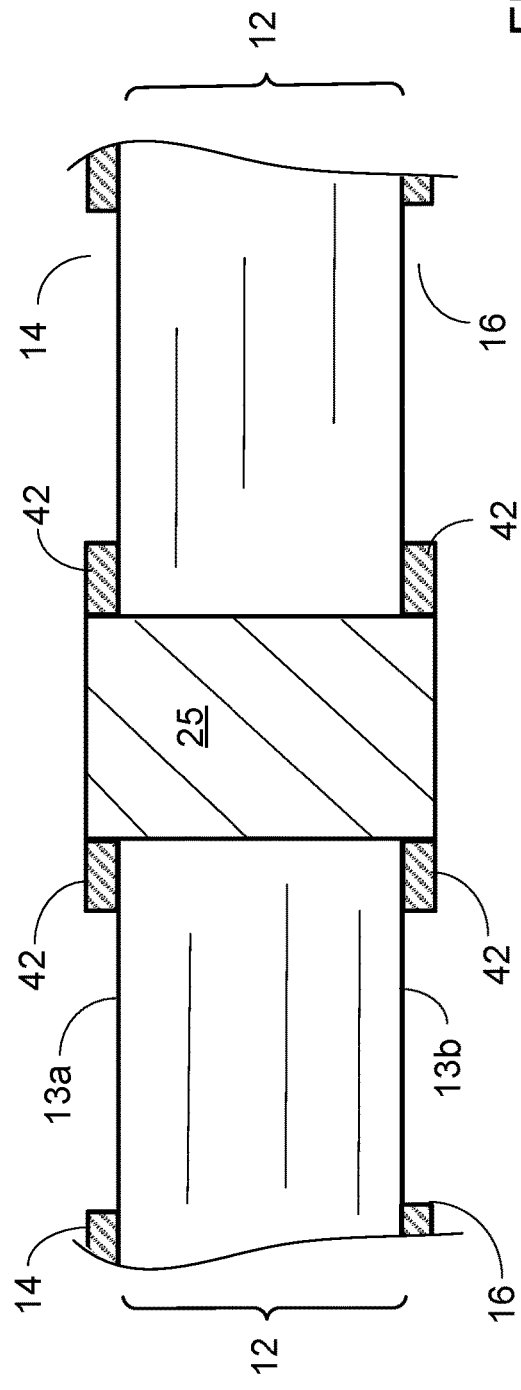
FIG. 22C

PLANAR INDUCTIVE APPARATUS AND METHOD

CROSS-REFERENCE TO RELATED APPLICATION

This applications is related to U.S. patent application Ser. No. 16/878,280, filed on May 19, 2020, titled "PLANAR INDUCTIVE APPARATUS AND METHOD," the entire contents of which are incorporated by reference.

TECHNICAL FIELD

This invention relates generally to planar magnetic structures and more specifically to methods for making planar magnetic devices.

BACKGROUND

Inductive devices (e.g., inductors, transformers) are used in electrical and electronic circuits (e.g., switching power converters). A planar-magnetic inductive device may include a magnetically permeable core arranged in proximity to one or more windings formed in or on a planar substrate, e.g., a multi-layer printed circuit board ("PCB"); the terms "substrate," "planar substrate," and "PCB" depending on context may have the same meaning when used herein). The magnetically permeable core may also include magnetically permeable material passing through one or more holes or apertures in the substrate. The substrate may comprise one or more electrically conductive layers with windings formed on one or more of the layers. The layers that form the substrate may be made of any of a variety of non-conductive materials (e.g. fiberglass, ceramic). The benefits of planar construction relative to alternative means of construction (e.g., turns of wire arranged around a magnetic core structure) may include improved density, manufacturability, lower cost, and better repeatability of operating characteristics. The magnetically permeable core may include plates attached to one or more surfaces of the substrate. As used herein, a planar inductive device refers to an inductive device, such as an inductor or transformer, having a planar magnetic structure including at least one electrically conductive winding formed in a generally planar substrate and coupled to a planar magnetic core structure, which may be attached to at least one surface of the substrate.

SUMMARY

In general, in one aspect, a method of making a planar inductive device includes the steps of: providing a generally planar substrate having a top outer surface and a bottom outer surface; providing a spacer that lies upon and extends a substantially uniform distance, T, from the top outer surface or the bottom outer surface of the planar substrate; forming an aperture in the substrate and the spacer, in which the substrate includes a conductive feature that aligns with the aperture and forms a winding around the aperture; depositing a malleable magnetically permeable material into the aperture; and curing the malleable magnetic material to form a solid plug within the aperture.

The above general aspect may include one or more of the following features. The step of depositing can include delivering a volume of malleable magnetic material into each aperture to fill the aperture and extend outside of the aperture; and the method can further include: partially curing the malleable magnetic material; and compressing the partially cured magnetic material into the aperture. The malleable magnetically permeable material can include a heat-curable binder, and the step of curing can include heating the substrate. The method can further include the step of: planarizing the device to make an end surface of the plug coplanar with the extension of the spacer and parallel to the top outer surface or the bottom outer surface. The device can include two or more plugs, each plug passing through a first spacer on the top outer surface and a second spacer on the bottom outer surface, and the step of planarization can include: planarizing the top and bottom of the device to make the end surfaces of the plugs parallel to, and coplanar with the extension of the spacer on, their respective outer surface. The method can further include the step of: providing a pair of core pieces, one located on the top outer surface and the other located on the bottom outer surface, the core pieces forming a flux path for directing flux through a pair of plugs.

The planar substrate can include a multilayer printed circuit board (PCB). Providing the spacer can include providing a conductive feature on the top outer surface or the bottom outer surface of the substrate. Providing the spacer can include providing a non-conductive feature on the top outer surface or the bottom outer surface of the substrate. Providing a non-conductive feature on the top outer surface or the bottom outer surface can include depositing a non-conductive material onto the top outer surface or the bottom outer surface.

The malleable magnetically permeable material can include a magnetically permeable powder that includes magnetically permeable particles. The binder can be a thermoset. In some examples, forming an aperture can include drilling. In some examples, forming an aperture can include punching. In some examples, forming an aperture can include routing. In some examples, forming an aperture can include laser machining. The magnetically permeable powder can include a carbonyl iron powder. The magnetically permeable powder can include a ferrite powder. The magnetically permeable powder can include a powdered oxide of silicon. The powder can include a mixture of magnetically permeable powders. The mixture of powders can include carbonyl iron powder and ferrite powder. In some examples, the powder can have an average particle size less than 10 microns. In some examples, the powder can have an average particle size between 10 microns and 100 microns. In some examples, the powder can have an average particle size greater than 100 microns. The thermoset can be a polyimide thermoset.

The planar substrate can include a conductive material on the top outer surface or the bottom outer surface, and providing the spacer can include removing a portion of the conductive material. Removing a portion of the conductive material can include: masking the conductive material at the location of the spacer; and removing conductive material from unmasked portions of the conductive layer. The method can further include masking an exposed end of the solid plug. Providing a spacer can further include: configuring a feature in the conductive material to prevent the spacer from forming an uninterrupted conductive ring around the aperture. The feature can be provided prior to removing a portion of the conductive material. The feature can include a notch. The method can further include depositing a non-conductive protective material into the feature. Removing a portion of the conductive material can include: providing a mask outside of a spacer region, the spacer region overlapping and surrounding an aperture location;

removing conductive material from the spacer region; and depositing a non-conductive spacer material in the spacer region. Forming the aperture can include configuring the aperture within the spacer region. Removing conductive material can include chemical etching.

The depositing malleable magnetically permeable material can include: locating a stencil over the top outer surface or the bottom outer surface of the substrate; and moving the malleable magnetically permeable material through an opening in the stencil. In some examples, depositing malleable magnetically permeable material can include spreading paste or slurry over the stencil and using a flexible runner to force paste or slurry into the aperture. In some examples, depositing malleable magnetically permeable material includes injecting malleable magnetically permeable material into the aperture. Compressing the partially cured malleable magnetically permeable material can include compressing under a full or partial vacuum. Delivering malleable magnetically permeable material can include delivering under a full or partial vacuum. Compressing into the aperture can include pressing the substrate between planar plates. The method can further include: providing a non-stick planar surface on the surfaces of the planar plates to prevent the plug material from adhering to the plates. The non-stick planar surface can include polytetrafluoroethylene (PTFE). In some examples, planarizing can include lapping. In some examples, planarizing can include sanding.

In some examples, no gap is provided between a core piece and the ends of the pair of plugs spanned by the core piece. In some examples, a gap is provided between a core piece and the ends of the pair of plugs spanned by the core piece. In some examples, the relative permeability of the magnetically permeable material can be greater than 2. In some examples, the relative permeability of the solid plug can be between 5 and 40. Forming an aperture can include forming an aperture that passes all the way through the substrate. The malleable magnetically permeable material can include a paste or slurry having a viscosity in the range of 75,000 to 720,000 centipoise. The paste or slurry can include a magnetically permeable material and a liquid binder.

In some examples, conductive features on two or more layers of the multilayer PCB surround an aperture. In some examples, conductive features on two or more layers of the PCB form windings that surround an aperture. Compressing the partially cured malleable magnetically permeable material can include compressing under a full or partial vacuum. Providing the spacer can further include: configuring a feature in the conductive material to establish an interrupted conductive ring around the aperture. The method can further include: electrically connecting a first end and a second end of the interrupted conductive ring to another conductive feature, in which the interrupted conductive ring is configured to form an auxiliary winding electromagnetically coupled to the plug. The auxiliary winding can be electrically connected to the winding around the aperture.

In general, in another aspect, a method includes: providing a generally planar substrate having a top outer surface and a bottom outer surface; providing a spacer on at least one of the outer surfaces, the spacer extending a predetermined distance, T, above the at least one outer surface; depositing a malleable magnetically permeable material into one or more apertures in the substrate at least to the height of the spacer, the malleable magnetically permeable material including a magnetic paste or slurry including a magnetically permeable material and a liquid binder. The substrate includes a conductive feature that aligns with an aperture and forms a winding around the aperture; and at least partially curing the magnetic paste or slurry.

Implementations of the above aspects may include one or more of the following features. The spacer can be provided at the one or more apertures, the spacer can surround a circumference of each aperture; and the depositing can be performed through an opening in the spacer. The providing a spacer can further include: providing a material of substantially uniform height at locations for the one or more apertures, the material covering the locations of the one or more apertures; and forming an aperture in the material at the locations of the one or more apertures. The forming an aperture in the material at the locations of the one or more apertures can produce the one or more apertures in the substrate. The method can further include compressing the at least partially cured magnetic paste or slurry in the one or more apertures. The method can further include fully curing the magnetic paste or slurry.

The step of depositing can further include: delivering the paste or slurry into the one or more apertures in a sufficient quantity to fill the one or more apertures and a volume outside each of the one or more apertures; and compressing the at least partially cured paste or slurry into the aperture to form a plug within the aperture. The spacers can be provided on both of the outer surfaces. The method can further include the step of: providing a pair of magnetically permeable core pieces, one located on the top outer surface and the other located on the bottom outer surface, the core pieces forming a flux path for directing flux through the cured magnetic paste or slurry in at least two apertures.

The method can further include removing the spacer after the magnetic paste or slurry is at least partially cured. The spacer can include a metallic layer on the top or bottom outer surface of the substrate. The metallic layer can be patterned to form an interrupted ring around the one or more apertures. The method can further include mounting magnetically permeable core pieces to the top outer surface and to the bottom outer surface of the substrate, the core pieces forming a magnetic circuit with the cured magnetic paste or slurry in at least two of the one or more filled apertures. The method can further include attaching electronic components to the substrate, the electronic components being electrically connected to one or more conductive windings formed in metallic layers in the substrate around one or more of the filled apertures. The electronic components and magnetic circuit can form a switching power converter having an input and an output, and the electronic components can be adapted to convert power received from the input for delivery to the output.

The planar substrate can include a multilayer printed circuit board (PCB). Providing the spacer can include providing a conductive feature on the top outer surface or the bottom outer surface of the substrate. Providing the spacer can include providing a non-conductive feature on the top outer surface or the bottom outer surface of the substrate. Providing a non-conductive feature on the top outer surface or the bottom outer surface can include depositing a non-conductive material onto the top outer surface or the bottom outer surface.

The malleable magnetically permeable material can include a magnetically permeable powder that includes magnetically permeable particles. The binder can be a thermoset. In some examples, forming an aperture can include drilling. In some examples, forming an aperture can include punching. In some examples, forming an aperture can include routing. In some examples, forming an aperture can include laser machining. The magnetically permeable powder can include a carbonyl iron powder. The magnetically permeable powder can include a ferrite powder. The magnetically permeable powder can include a powdered oxide of silicon. The powder can include a mixture of magnetically permeable powders. The mixture of powders can include carbonyl iron powder and ferrite powder. In some examples, the powder can have an average particle size less than 10 microns. In some examples, the powder can have an average particle size between 10 microns and 100 microns. In some examples, the powder can have an average particle size greater than 100 microns. The thermoset can be a polyimide thermoset.

In some examples, the relative permeability of the magnetically permeable material can be greater than 2. In some examples, the relative permeability of the solid plug can be between 5 and 40. Providing a material of substantially uniform height can include providing a conductive layer. Forming an aperture can include forming an aperture that passes all the way through the substrate. The malleable magnetically permeable material can include a paste or slurry having a viscosity in the range of 75,000 to 720,000 centipoise. The paste or slurry can include a magnetically permeable material and a liquid binder. In some examples, conductive features on two or more layers of the multilayer PCB surround an aperture. In some examples, conductive features on two or more layers of the PCB form windings that surround an aperture. Depositing malleable magnetically permeable material can include depositing under a full or partial vacuum. Compressing into the aperture can include pressing the substrate between planar plates. The method can further include: providing a non-stick planar surface on the surfaces of the planar plates to prevent the plug material from adhering to the plates. The non-stick planar surface can include polytetrafluoroethylene (PTFE). The method can further include planarizing a surface of the device to make the end surface of a plug parallel to, and coplanar with, the extension of the spacer on the surface. In some examples, the planarizing can include lapping. In some examples, the planarizing can include sanding.

In general, in another aspect, a method of manufacturing a printed circuit board (PCB) with embedded magnetically permeable features includes the steps of: assembling a multilayer PCB stack having a plurality of patterned conductive layers separated by one or more insulative layers, the stack having an un-patterned top conductive layer and an un-patterned bottom conductive layer; forming apertures in the PCB at locations of magnetically permeable features, in which the PCB includes a conductive feature that aligns with an aperture and forms a winding around the aperture; and delivering a volume of malleable magnetically permeable material into each aperture to fill the aperture and extend beyond outer surfaces of the top and bottom conductive layers, the malleable magnetically permeable material including a magnetic paste or slurry including a magnetically permeable material and a liquid binder. The method further includes the steps of: heating the PCB to partially cure the malleable material; compressing the partially cured malleable material into the apertures; heating the PCB to cure the malleable material into a solid plug; planarizing the top and bottom of the PCB to make the end surfaces of the plugs coplanar with and parallel to outer surfaces of the top and bottom conductive layers; and etching the top and bottom conductive layers.

Implementations of the above aspects may include one or more of the following features. The method can further include removing conductive material from the top and bottom conductive layers at pre-determined locations overlapping the locations of the magnetically permeable features. The method can further include applying a non-conductive material to the pre-determined locations. The step of removing can include creating notches at the pre-determined locations. The method can further include: before the step of etching, masking the top and bottom surfaces in regions that overlap the ends of each plug, and after the step of etching, removing the mask. The method can further include: before the step of etching, masking the top and bottom surfaces in regions that overlap the ends of each plug and some or all of each notch, and after the step of etching, removing the mask. Creating a notch can include routing. The method can further include: an additional etching step for etching away some or all of the conductive material from around the circumference of the plugs. The step of etching can create regions of conductive material surrounding the circumference of each plug, each region of conductive material interrupted by a respective notch. The step of removing can include: masking the top and bottom conductive layers, except at pre-determined locations overlapping the circumferences of the locations of the magnetically permeable features, and etching the top and bottom conductive layers to remove conductive material from the pre-determined locations. The non-conductive material can include a thermoset polyimide. The non-conductive material can include a drillable epoxy.

In some examples, the step of delivering a volume of malleable magnetically permeable material can include: arranging a stencil above the PCB, the stencil having openings at the aperture locations; spreading the malleable magnetically permeable material over the surface of the stencil; forcing the malleable magnetically permeable material into the apertures by dragging a flexible runner over the surface of the stencil. In some examples, the step of delivering a volume of malleable magnetically permeable material can include dispensing using a nozzle. The volume of malleable magnetically permeable material can be delivered under a full or partial vacuum. The step of compressing can include compressing the PCB between planar plates. The planar plates can include a non-stick coating. The non-stick coating can include polytetrafluoroethylene (PTFE). The step of compressing can include compressing under a full or partial vacuum. The step of planarizing can include lapping. The step of planarizing can include sanding. The step of etching can include patterning etch for electronic circuitry on a conductive layer. Conductive features on two or more layers of the PCB can form windings that surround an aperture.

The malleable magnetically permeable material can include a magnetically permeable powder that includes magnetically permeable particles. The binder can be a thermoset. In some examples, forming an aperture can include drilling. In some examples, forming an aperture can include punching. In some examples, forming an aperture can include routing. In some examples, forming an aperture can include laser machining. The magnetically permeable powder can include a carbonyl iron powder. The magnetically permeable powder can include a ferrite powder. The magnetically permeable powder can include a powdered oxide of silicon. The powder can include a mixture of magnetically permeable powders. The mixture of powders can include carbonyl iron powder and ferrite powder. In some examples, the powder can have an average particle size less than 10 microns. In some examples, the powder can have an average particle size between 10 microns and 100 microns. In some examples, the powder can have an average particle size greater than 100 microns. The thermoset can be a polyimide thermoset.

In some examples, the relative permeability of the magnetically permeable material can be greater than 2. In some examples, the relative permeability of the solid plug can be between 5 and 40. Forming an aperture can include forming an aperture that passes all the way through the substrate. The malleable magnetically permeable material can include a paste or slurry having a viscosity in the range of 75,000 to 720,000 centipoise. The paste or slurry can include a magnetically permeable material and a liquid binder.

In general, in another aspect, a method is provided for depositing a malleable magnetically permeable material into one or more apertures in a substrate, the substrate including a conductive feature that aligns with an aperture and forms a winding around the aperture. The method includes: providing a template over a top surface of the substrate, the template including a perforation or perforations that align with one or more of the apertures; spreading the malleable magnetically permeable material over the surface of the template; and forcing the malleable magnetically permeable material to flow into the apertures.

Implementations of the above aspects may include one or more of the following features. The template can be a reusable template. Providing a template can further include establishing a space between the bottom surface of the template and the top surface of the substrate. The space can be substantially uniform across the entire surface of the substrate. The template can include stainless steel. The space can be in the range of 0 to 500 micrometers (0 to 0.020"). Providing a template can include applying a mask of substantially uniform thickness upon the top surface of the substrate. The step of spreading can include: providing a spreader bar; establishing a uniform distance between the spreader bar and the surface of the stencil; and dragging the spreader bar parallel to the surface of the stencil. The spreader bar can include a steel bar. Forcing the malleable magnetically permeable material to flow into the apertures can include: providing a flexible runner; locating the runner in contact with the stencil; and dragging the runner along the surface of the stencil. The method can further include establishing an angle of the runner relative to the top surface of the stencil. The angle can be in the range of 30° to 90°. The thickness of the template can be in the range of 50 to 150 micrometers (0.002" to 0.006"). The uniform distance can be in the range of 25 to 250 micrometers (0.001" to 0.010").

In general, in another aspect, an apparatus includes: a planar inductive device including: a generally planar substrate having a top outer surface and a bottom outer surface; a spacer that lies upon and extends a substantially uniform distance, T, from the top outer surface outer surface of the planar substrate, in which the substrate and the spacer define an aperture in the substrate and the spacer, the substrate includes a conductive feature that aligns with the aperture and forms a winding around the aperture; and a plug including a magnetically permeable material disposed in the aperture, an end of the plug extends beyond the top outer surface, and the spacer surrounds a portion of the plug that extends beyond the top out surface.

In general, in another aspect, an apparatus including: a generally planar substrate having a top outer surface and a bottom outer surface; one or more spacers on at least one of the outer surfaces, each spacer extending a predetermined distance, T, from the at least one outer surface, in which the substrate and the one or more spacers define one or more apertures; and one or more magnetically permeable plugs disposed in the one or more apertures, in which each plug has a same height as the height of the corresponding spacer from the corresponding outer surface, the spacer surrounding a portion of the plug that extends beyond the corresponding outer surface, and the substrate includes a conductive feature that aligns with an aperture and forms a winding around the aperture.

In general, in another aspect, an apparatus including: a printed circuit board (PCB) having embedded magnetically permeable features, the printed circuit board including a multilayer PCB stack having a plurality of patterned conductive layers separated by one or more insulating layers, the stack having a top conductive layer and a bottom conductive layer. The printed circuit board defines apertures in the printed circuit board, the printed circuit board includes a conductive feature that aligns with an aperture and forms a winding around the aperture, magnetically permeable plugs are disposed in the apertures, end surfaces of the plugs are essentially coplanar with and parallel to outer surfaces of the top and bottom conductive layers, a top end of each of the plugs is at least partially surrounded by a spacer formed by a portion of the top conductive layer, and a bottom end of each of the plugs is at least partially surrounded by a spacer formed by a portion of the bottom conductive layer.

In general, in another aspect, an apparatus includes: a planar magnetic structure including a multilayer printed circuit board (PCB) having a first surface, a second surface, and conductive features arranged on conductive layers of the PCB to form one or more windings around one or more predetermined axes; a hole in the PCB at each of the one or more predetermined axes, each hole having an inner edge aligned with an inner circumference of one of the windings; a first magnetically permeable section affixed to the first surface of the PCB covering a selected one or more of the holes; a second magnetically permeable section affixed to the second surface of the PCB covering the selected one or more of the holes; and a magnetically permeable plug disposed in each of the selected one or more of the holes. The apparatus further includes, for each of the selected one or more of the holes, a first spacer that lies upon and extends a substantially uniform distance, T1, from the first surface of the planar substrate, and a second spacer that lies upon and extends a substantially uniform distance, T2, from the second surface of the planar substrate. The plug in the hole extends beyond the first and second surfaces, the first spacer surrounds a portion of the plug that extends beyond the first surface, and the second spacer surrounds a portion of the plug that extends beyond the second surface.

In general, in another aspect, a method of making a planar inductive device includes providing a generally planar substrate having a thickness, a first outer surface and a second outer surface separated by the thickness, and one or more apertures. A malleable magnetically-permeable material is deposited into the one or more apertures. The malleable magnetically-permeable material is at least partially cured to form a plug in the one or more apertures. The distance between the first end of the plug and the first outer surface of the substrate is controlled. Magnetically-permeable core plates are attached to the outer surfaces of the substrate covering the apertures and the ends of the plug.

Implementations of the above aspects may include one or more of the following features. The step of controlling the distance may form a recess between the end of the plug and the outer surface of the substrate. The recess may be a predetermined distance below the outer surface of the substrate. The end of the plug may be planarized. Conductive material may be added to the substrate to form the recess or to increase the depth of the recess between the outer surface and the end of the plug. Controlling the distance may include selectively removing a portion of the end of the plug. The selectively removing may include laser ablating or etching the first end of the plug to remove, or reduce the relative permeability of, magnetically-permeable material in the first end of the plug, or remove binder material in the first end of the plug. The removing may include cleaning the end of the plug. Controlling the distance may include laminating an additional layer onto the substrate to form the recess or to increase a depth of the recess between the resulting outer surface and the end of the plug. Controlling the distance may include laminating an insulation layer and a conductive layer onto the substrate to form the recess or to increase a depth of the recess between the resulting outer surface and the end of the plug.

In general, in another aspect, an apparatus includes a planar inductive device including a generally planar substrate having a thickness, a first outer surface, a second outer surface, the first and second outer surfaces being separated by the thickness, and one or more apertures in the substrate. The apparatus includes a magnetically-permeable plug including a first particulate magnetically-permeable material suspended in an at least partially cured binder material in the one or more apertures. Each plug has a first end and second end. The apparatus includes magnetically-permeable core plates attached to the first and second outer surfaces of the substrate, covering the aperture and the ends of the plug.

Implementations of the above aspects may include one or more of the following features. At least one of the core plates is secured using one or more of the following: (a) an adhesive between the core plate and the outer PCB surface, (b) an adhesive between the core plate and the end of the plug, (c) encapsulation material covering portions of the core plate and the outer PCB surface. The ends may be recessed beneath the outer PCB surface(s) to form a gap in the magnetically permeable circuit. The gap may have a relative permeability that is lower than that of the core plate or the plug. An adhesive may be provided between the core plate and the end of the plug. Particulate magnetically permeable material may be suspended in the adhesive. The relative permeability of the particulate magnetically permeable material may be lower than that of the plug. An adhesive may be provided between the core plate and the outer PCB surface. Encapsulation material may cover portions of the respective core plate and the outer PCB surface. The plug ends may extend beyond the outer PCB surfaces. An adhesive may be used between the core plate and the outer PCB surface. The ends may be essentially coplanar with the outer PCB surfaces.

The details of one or more embodiments of the subject matter described in this specification are set forth in the accompanying drawings and the description below. Other features, aspects, and advantages of the invention will become apparent from the description, the drawings, and the claims.

DESCRIPTION OF DRAWINGS

FIG. 22A is a cross-sectional view through a hole in a substrate filled with a magnetic plug.

FIG. 22B is a cross-sectional view through a hole in a substrate filled with a magnetic plug, where a conductive spacer surrounding the plug has been partially etched away.

FIG. 22C is a cross-sectional view through a hole in a substrate filled with a magnetic plug, where the plug is surrounded by a non-conductive spacer.

DETAILED DESCRIPTION

Planar magnetic devices are described in Vinciarelli, Self-Aligned Planar Magnetic Structure and Method, U.S. Pat. No. 10,468,181, issued Nov. 5, 2019 (the "Self-Aligned patent") and in Vinciarelli, Method and Apparatus for Delivering Power to Semiconductors, U.S. Pat. No. 10,454,380, issued Oct. 22, 2019 and U.S. Pat. No. 10,128,764, issued Nov. 13, 2018 (the "Power Delivery Patents") (all assigned to VLT Inc. of Sunnyvale, CA, USA; the entire disclosure of each patent is incorporated herein by reference).

Figure 1:
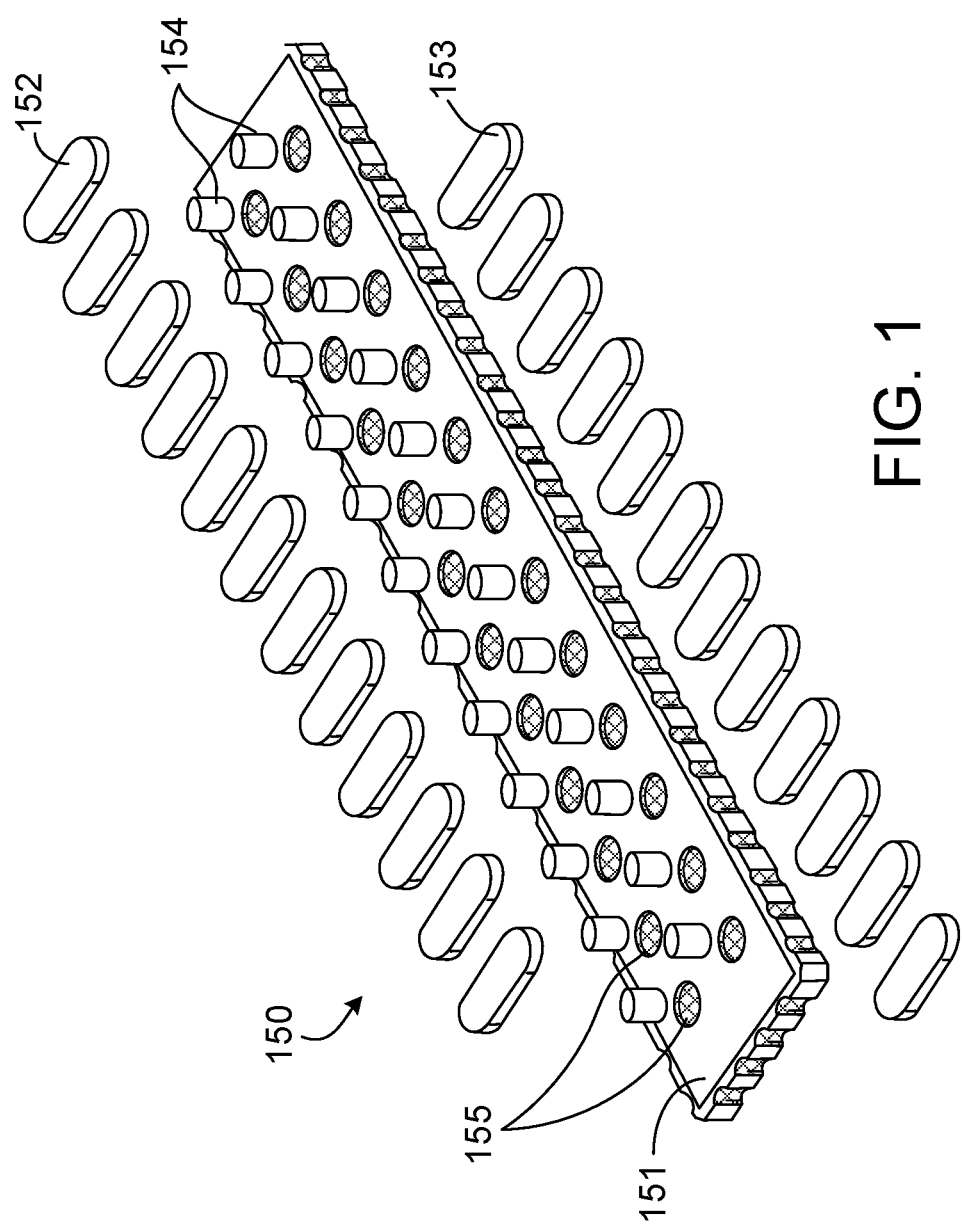
FIGS. 1, 2A, and 2B show perspective views of multilayer substrates comprising planar inductive devices.
Figure 2A:
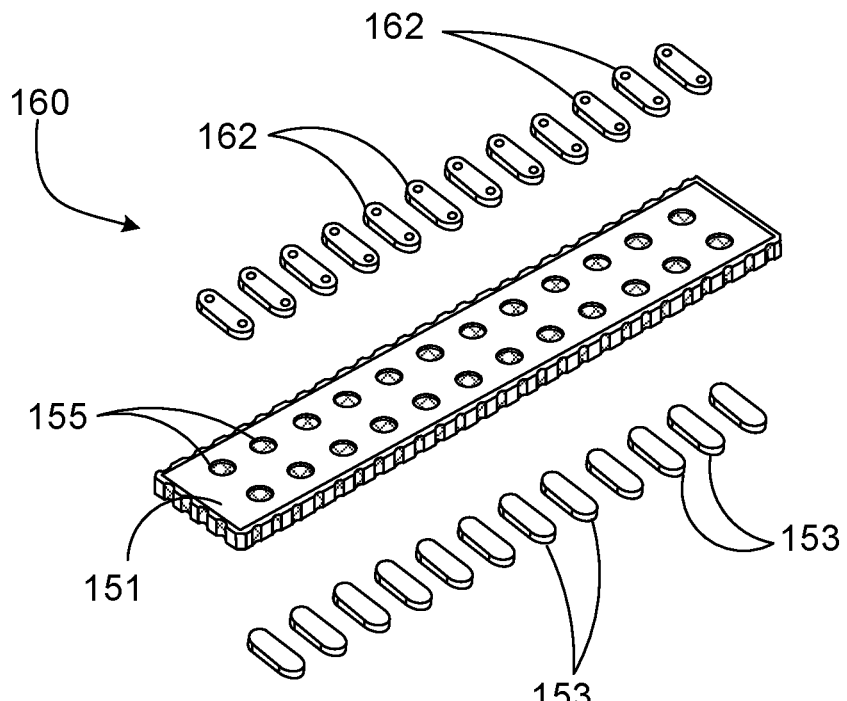
Figure 2B:
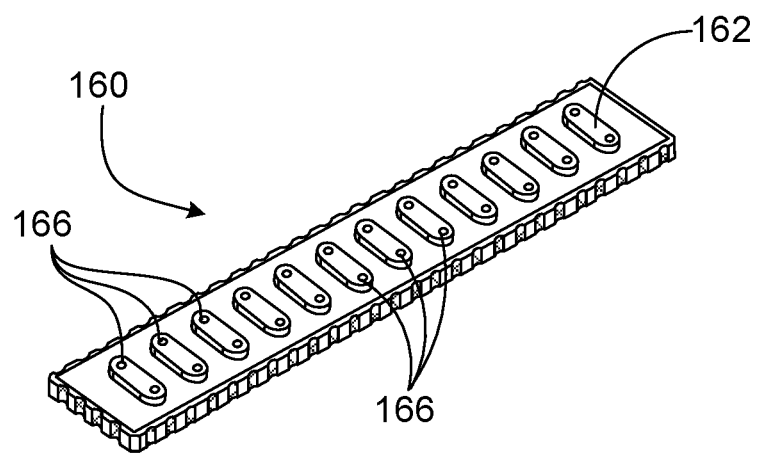
Figure 12:
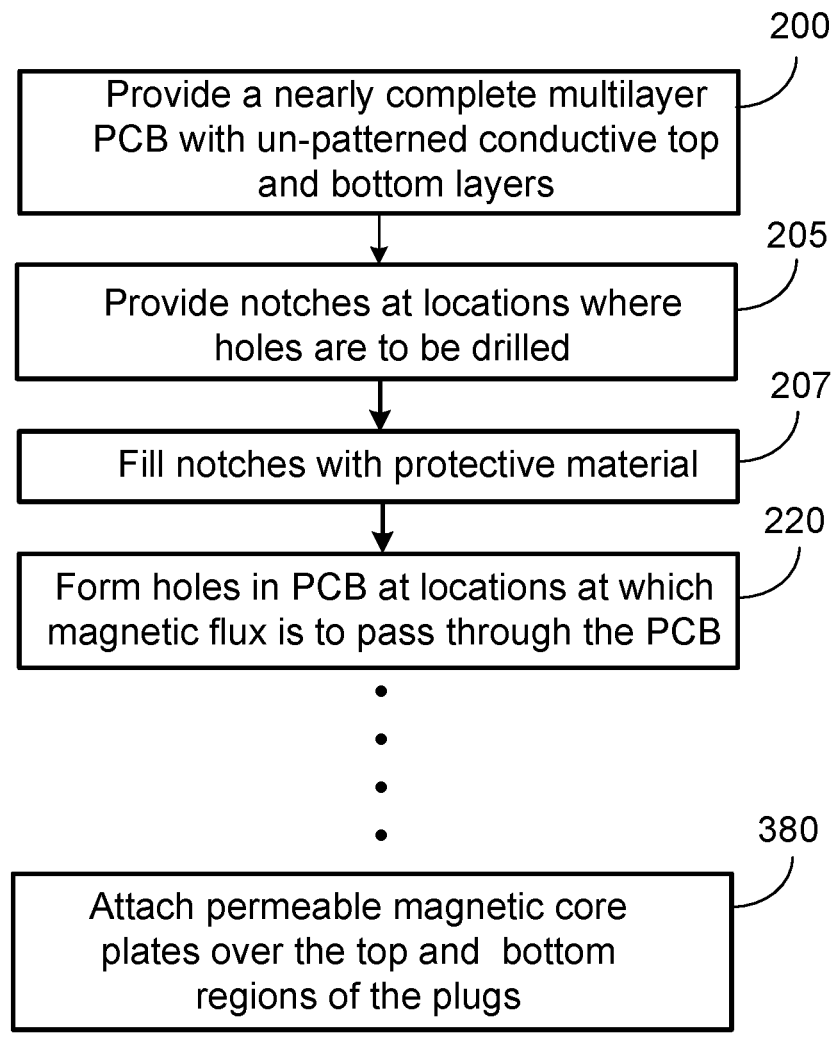
FIG. 12 shows steps in a method for making a planar magnetic device according to the invention.

FIG. 1 shows an embodiment of an inductive device 150 using a planar magnetic structure as described in the Power Delivery Patents (FIG. 1 is a reproduction of FIG. 12 in the Power Delivery Patents); FIGS. 2A and 2B show another embodiment 160 of an inductive device using a planar magnetic structure as described in the Power Delivery Patents (FIGS. 2A and 2B are reproductions of FIGS. 14A and 14B in the Power Delivery Patents). The inductive devices 150, 160 of FIGS. 1 and 2 each include a planar magnetic structure including a PCB 151, top magnetic core plates 152, 162, and bottom magnetic core plates 153. The PCB 151 comprises windings (not shown), preferably self-aligned windings as described in the Self-Aligned patent, formed around a plurality of holes 155.

The planar inductive device 150 of FIG. 1 may as shown have solid magnetic core legs 154 placed in holes 155 and mated with the top and bottom core plates 152 and 153 to form complete magnetic loops. A small gap may be provided between one or both of the top and bottom core plates and the legs. The planar inductive device 160 of FIG. 2 may comprise top magnetic core plates 162 that include apertures 166 arranged to align with apertures 155 in the PCB when the core plate 162 is in position. As disclosed in the Power Delivery Patents, the inductive device 160 may be fabricated by affixing the bottom core plates 153 to the bottom surface of the PCB 151 with a suitable adhesive such as epoxy. The top core plates 162 may be similarly affixed to the top surface of the PCB 151 with apertures 166 aligned with apertures 155. A magnetically permeable fluid, such as a powder, with or without a suitable binder material or other injectable material, may be injected through apertures 166 to fill the PCB apertures 155 and, alternatively, some or all of the core apertures 166. After the apertures are filled with the magnetically permeable material, the core apertures may be sealed with an epoxy or other suitable material to prevent the magnetically permeable material from escaping. Use of magnetic fluid or powder, instead of solid legs of magnetic material, may provide greater PCB aperture utilization and greater power conversion efficiency as described in the Power Delivery Patents.

Figure 25:
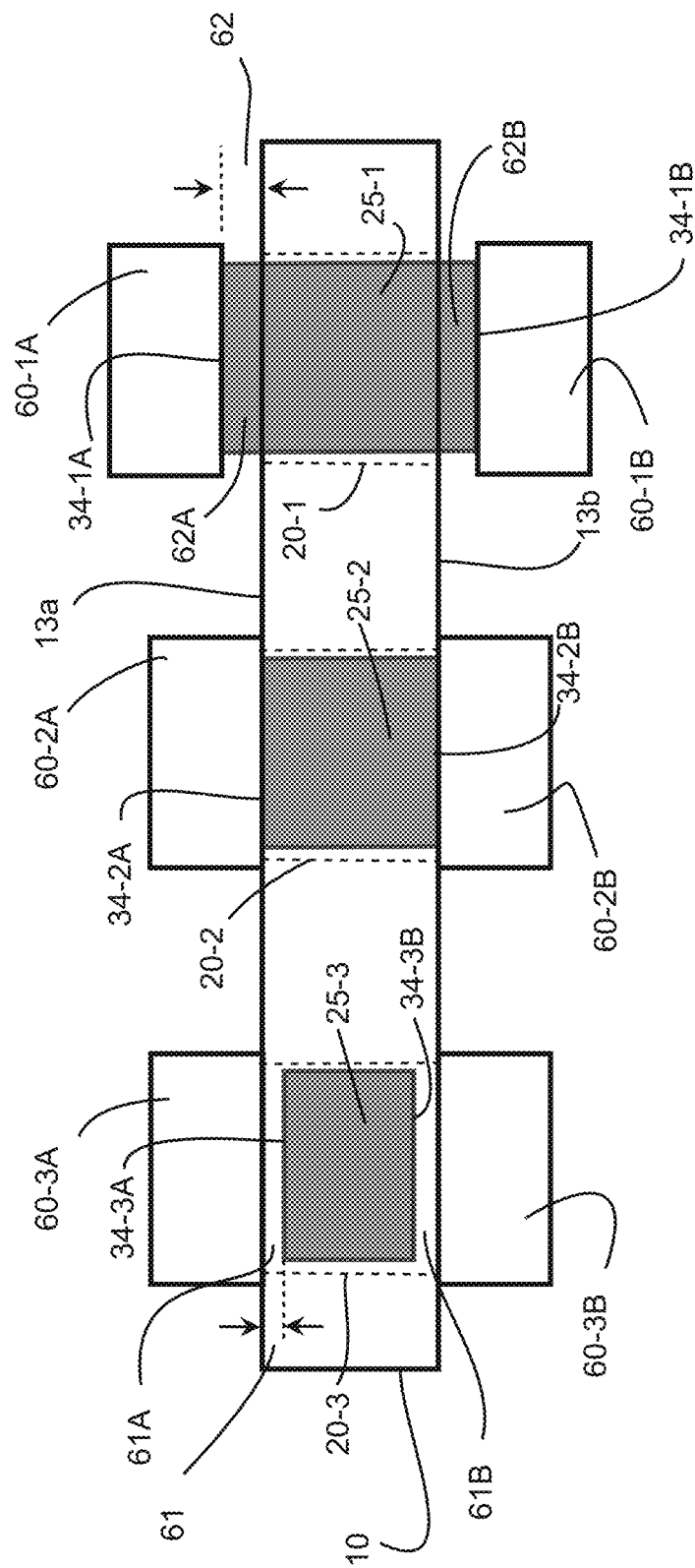
FIG. 25 is a cross-sectional view through planar inductive devices.

Referring to the cross-sectional view of FIG. 25, three holes 20-1, 20-2, 20-3 are shown in a PCB 10, each having a magnetically permeable plug 25-1, 25-2, 25-3, respectively, in the hole, and each being covered on the top by a core plate, e g. 60-1A, 60-2A, 60-3A, respectively and on the bottom by a core plate, e.g. 60-1B, 60-2B, and 60-3B, respectively. As used herein, a plug is a fully or partially cured paste or slurry as defined below. (In FIGS. 25-26, a small space between the sidewalls of the plugs and the sidewalls of the apertures is shown for clarity and readability, however, the methods described herein produce plugs that fully occupy the holes and thus are in contact with the sidewalls of the holes.) FIG. 25 shows three embodiments of plugs. The ends 34-2A, 34-2B of plug 25-2 in hole 20-2 are shown co-planar with the PCB surfaces with the core plates 60-2A and 60-2B resting on the plug ends and the surface of the PCB, i.e. without any gaps between the plug and the plates representing one ideal in maximizing the effective permeability of the core structure without sacrificing any core plate thickness in low profile applications. Hole 20-1 is shown having a plug with ends 34-1A and 34-1B that are proud of, i.e. extend beyond, the PCB exterior surfaces. Although no gap exists between the plug and the core plates, the core plates may not rest on the PCB surface, e.g. portions 62A and 62B are shown proud of the PCB surfaces creating a space 62 between the core plates and the PCB surfaces. The excess length of the core plugs ensure that no gaps exist in the magnetic circuit between the plug and the core plates, but may come at the expense of core plate thickness in low profile packages, which in turn may increase core losses during operation. Finally, hole 20-3 in FIG. 25, is shown having a plug 25-3 that is recessed from the PCB surfaces by distance 61, resulting in air gaps 61A and 61B in the magnetic circuit between the core plates and the ends 34-3A and 34-3B of the core plug and the core plates. A controlled gap between the plug and the core plates may provide an additional control of the effective permeability of the magnetic circuit (as described in greater detail below) without changing the relative permeability of the magnetically permeable core material, either in the core plates or the core legs (which due to the nature of the following processes may be called plugs, pasted plugs, or pasted legs), for use in different electronic circuit configurations, e.g. different power converters.

Figure 3:
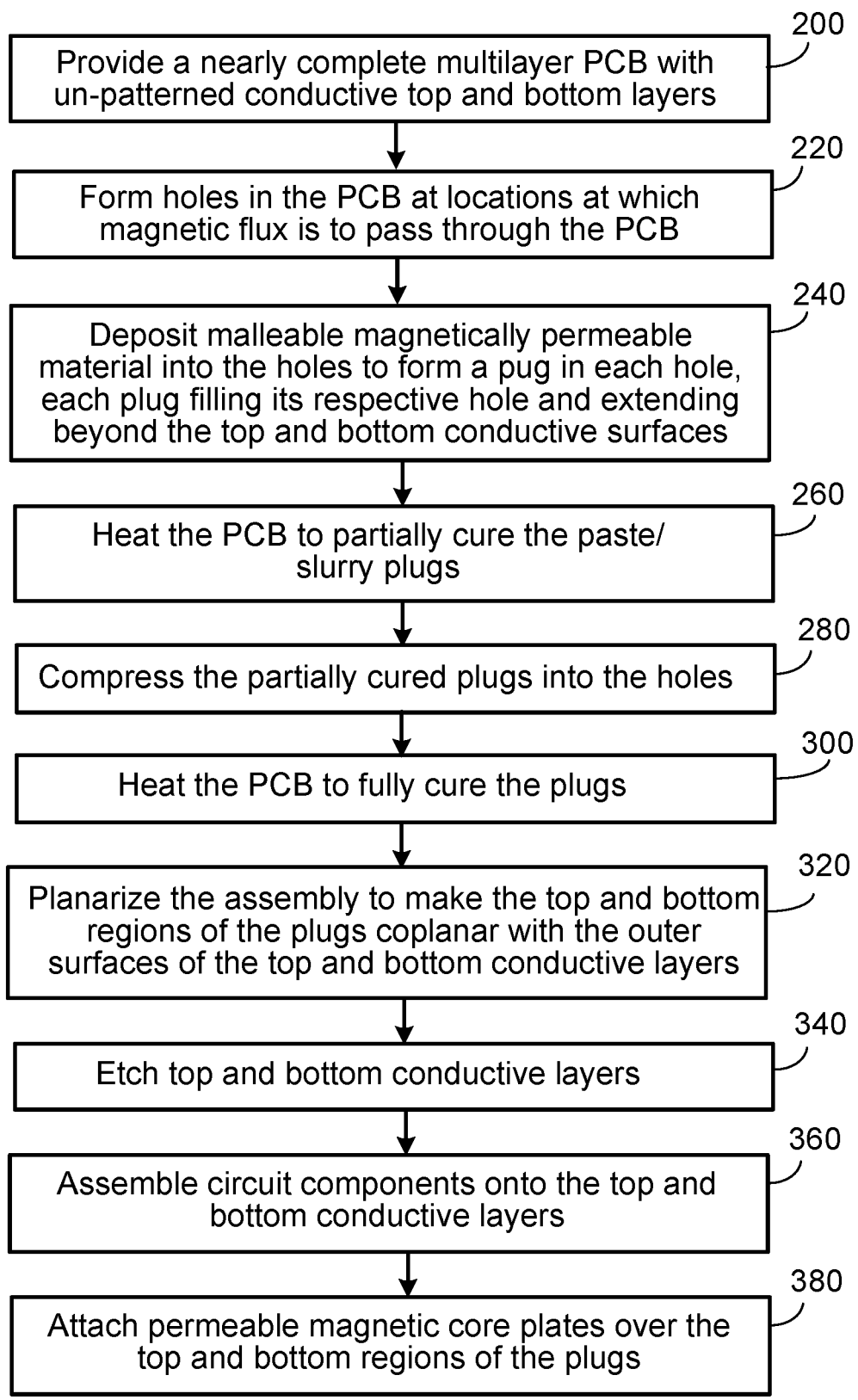
FIG. 3. shows steps in a method for making a planar inductive device according to the invention.
Figure 4:
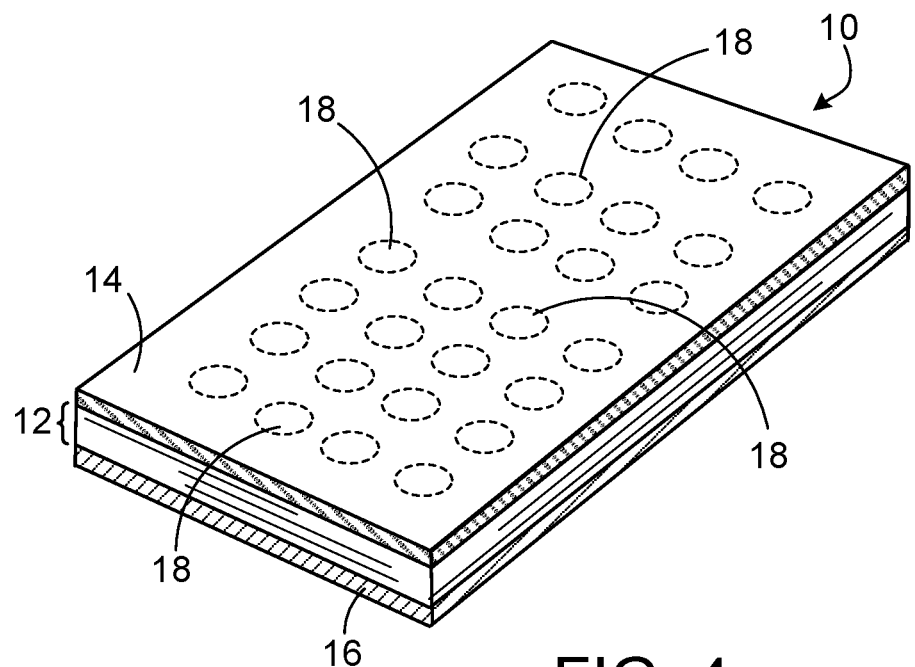
FIG. 4 shows a perspective view of a multilayer substrate for use in a planar inductive device.

The steps in a first method for manufacturing an electronic assembly comprising a planar inductive device according the invention will be described in connection with FIG. 3. As shown in FIG. 3, the process may start with a nearly complete multilayer PCB 10 (FIG. 4) manufactured traditionally. Referring to step 200 (FIG. 3), the nearly complete multilayer PCB 10 (FIG. 4) may include completed inner layers 12, i.e. the inner conductive layers have been patterned and laminated and inter-layer conductive vias formed, etc. using standard manufacturing processes. In a first example, the process shown in FIG. 3 may begin with a PCB stack including un-patterned conductive layers 14, 16 on the outermost surfaces, i.e. the nearly complete multilayer PCB has un-patterned conductive top and bottom layers 14, 16. The PCB 10 may be plated and/or planarized to a uniform thickness. Dashed circles 18, shown on top surface, e.g. conductive layer 14 (FIG. 4), illustrate predetermined locations where holes are to be formed to provide flux paths through the PCB, e.g. for magnetically permeable core legs.

Figure 5:
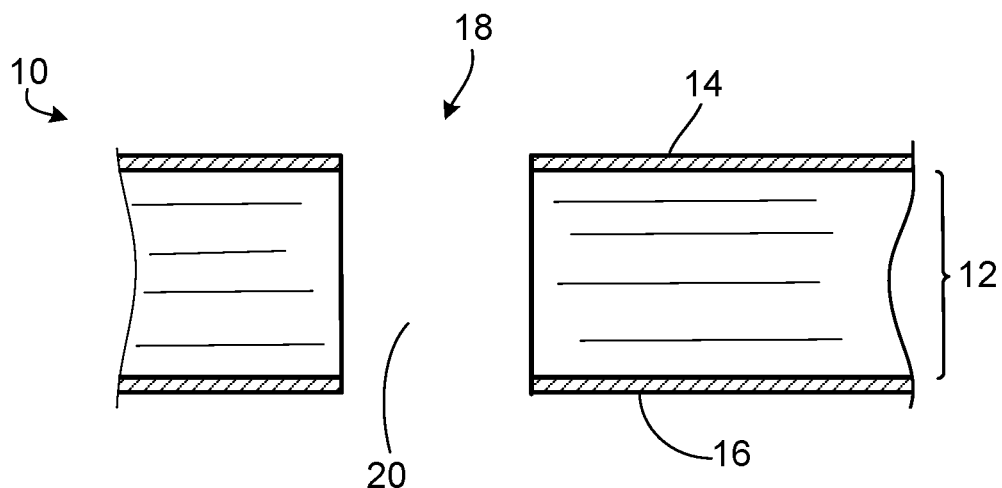
FIG. 5 shows a cross-sectional view of a hole in the substrate of FIG. 4.

Holes may be formed in the PCB 10 as shown in process step 220 (FIG. 3). Holes may preferably extend through the substrate, as illustrated in FIG. 5, e.g. hole 20 at location 18. The holes may be formed by any of a variety of known processes such as drilling, routing, punching, laser machining, etc. The inner conductive layers of PCB 10 may include windings (not shown) formed around the holes 20. Preferably the windings are formed using the self-aligned process described in the Self-Aligned patent.

Figure 6A:
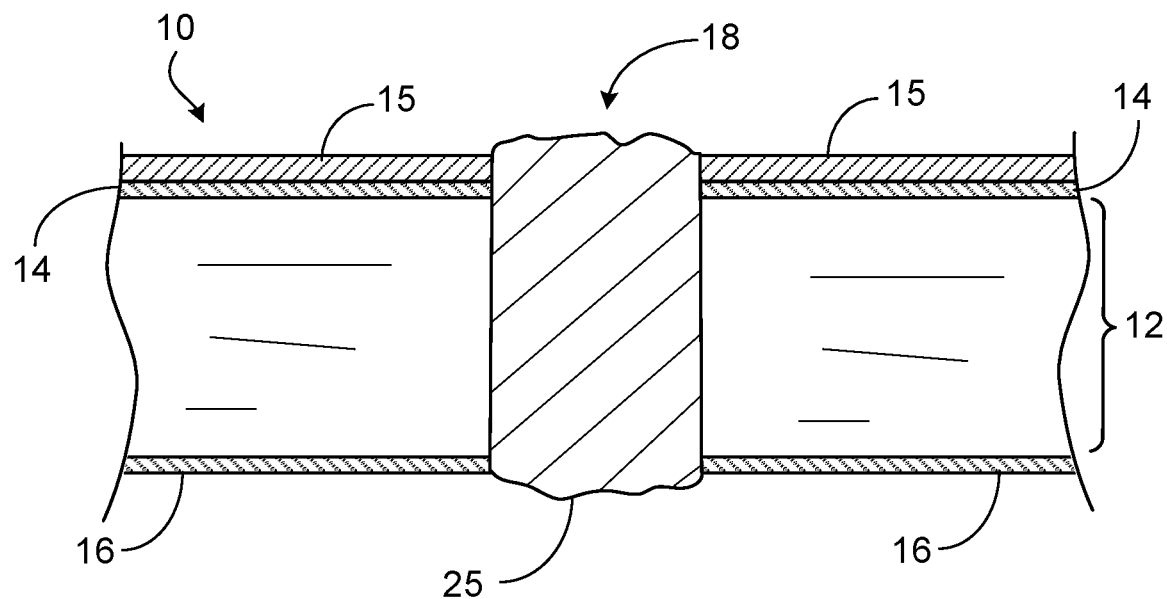
FIGS. 6A and 6B are cross-sectional views through the hole in the substrate filled with magnetically permeable material.
Figure 6B:
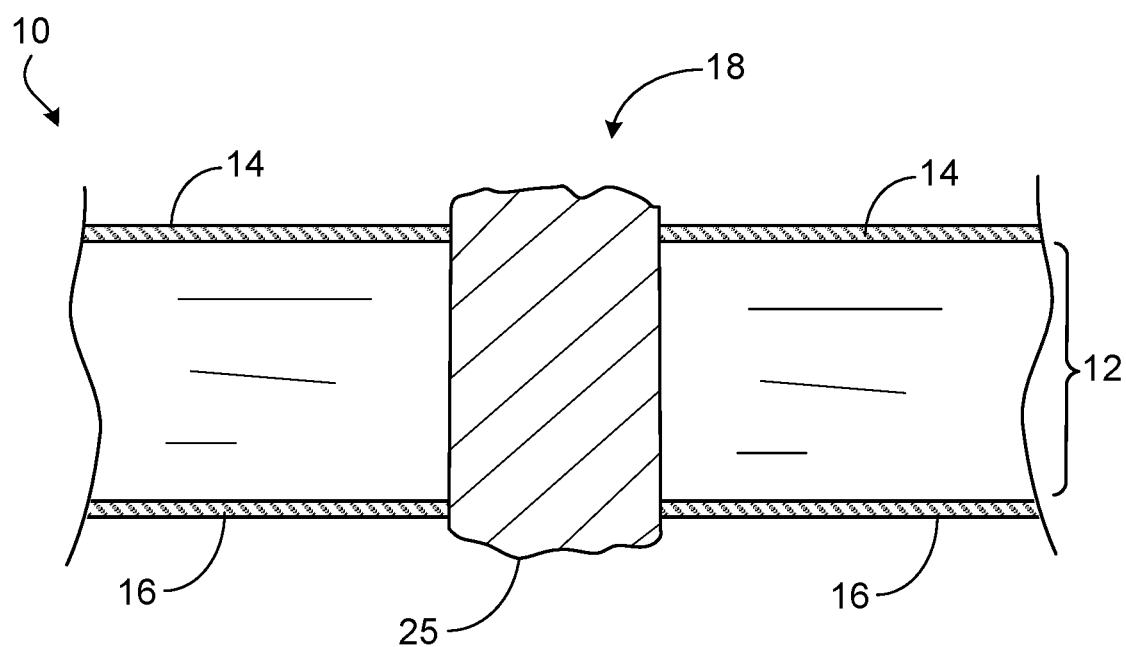

Referring to step 240 in FIG. 3, the holes 20 may be filled with a malleable magnetically permeable material, for example a paste or slurry, preferably having a consistency making it amenable to filling small holes in the PCB (hereinafter "paste/slurry"). The paste/slurry may comprise magnetically permeable particles and preferably an uncured liquid binder. As shown in FIG. 6A, one way to deposit the paste/slurry in the holes is to provide a stencil 15 (having openings aligned with the holes to be filled) over one surface of PCB, e.g. the top surface 14 as shown, and print, inject, squeegee, or otherwise dispense the paste/slurry into the holes. FIG. 6B shows the PCB after the stencil has been removed. An amount of paste/slurry has been deposited in each hole to form a plug 25 that fills the entire hole and may preferably extend beyond the outer surfaces of the top and bottom layers 14, 16 of the PCB as shown. Another way to deposit the paste/slurry may comprise depositing it directly into the holes via one or more nozzles (e.g. a single or multi-head 3D printer) which may use less material than stencil printing. Preferably, steps 240 and 280 may be performed in a full or partial vacuum environment which may help reduce or eliminate voids or trapped gas in the paste or slurry. In this example, a full vacuum environment refers to an environment having a pressure level less than 50 Pascals, and a partial vacuum environment refers to an environment having a pressure level less than 1000 Pascals.

Figure 7:
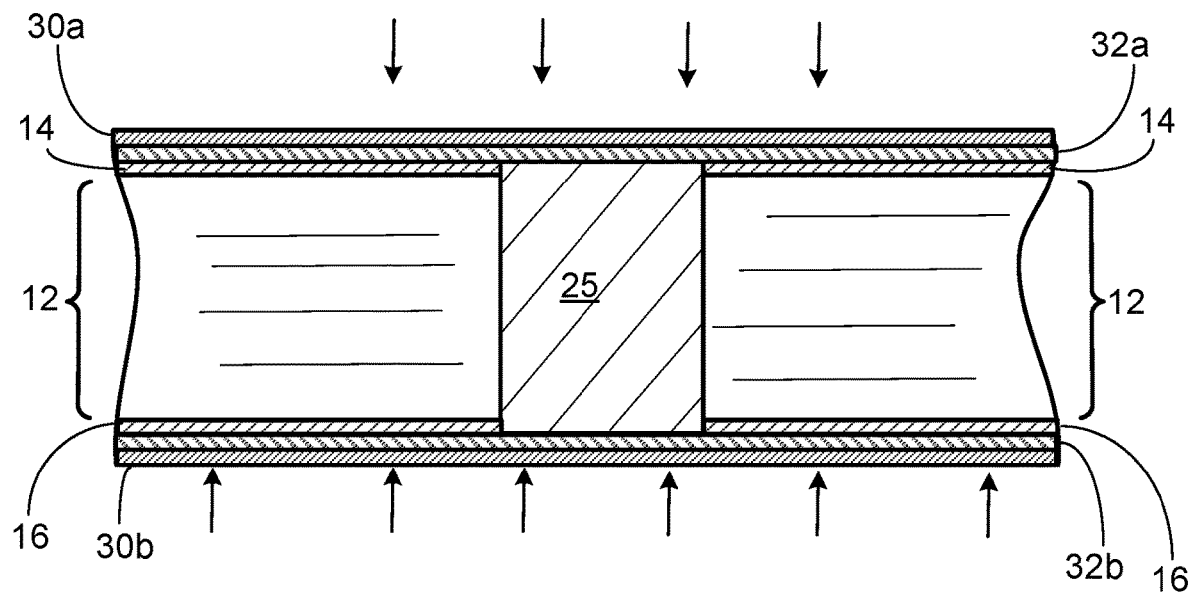
FIG. 7 is a cross-sectional schematic view through the filled hole in the substrate showing the magnetically permeable material undergoing a compression step.

Referring to step 260 in FIG. 3, the PCB assembly may be heated to partially cure the paste/slurry to form plugs 25 so that an outer skin solidifies while the interiors of the plugs remain mostly uncured and compressible. The PCB may be pressed between planar plates 30a, 30b, thereby compressing the partially cured plugs 25 in the holes and making the top and bottom surfaces of the plugs substantially coplanar with the outer surfaces of the top and bottom layers 14, 16 as described in step 280 (FIG. 3) and illustrated in FIG. 7. The compressive force is illustrated by the arrows essentially normal to the PCB surfaces in FIG. 7. To prevent the plug material from sticking to the planar plates 30a, 30b, a planar non-stick coating or layer, e.g. Polytetrafluoroethylene (PTFE) material 32a, 32b, may be provided between each of the planar plates 30a, 30b of the press and the PCB. Step 280 may also be performed in a full or partial vacuum environment.

Figure 8:
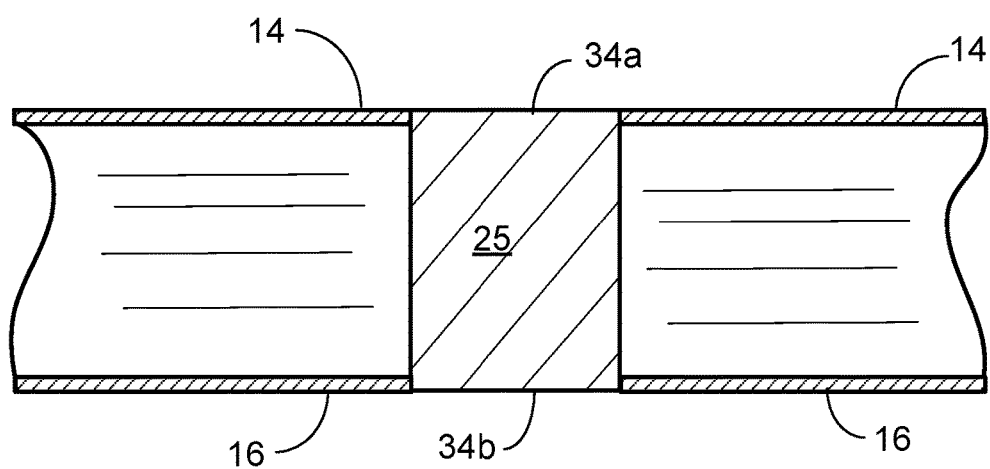
FIG. 8 is a cross-sectional view through the hole in the substrate after undergoing compression.

Next the compressed plugs may be heated until fully cured as described in step 300 (FIG. 3), e.g. by heating the entire PCB. Preferably, the PCB is kept in a full or partial vacuum environment throughout steps 240 and 280 to help reduce or eliminate voids or trapped gas in the paste or slurry until the plugs are compressed. After the plugs are cured, the top and bottom surfaces of the PCB may be planarized (e.g. by sanding or lapping with abrasive material) to smooth imperfections in the top and bottom surfaces of the plugs and ensure coplanarity of the top and bottom surfaces of the plugs 34a, 34b and the outer surfaces of the top and bottom layers 14, 16 as described in step 320 (FIG. 3) and illustrated in FIG. 8. The top and bottom layers 14, 16 of the PCB may be etched to form the top and bottom circuit patterns, preferably after the plugs are planarized, as described in step 340 (FIG. 3). The steps in the etching process (step 340) may, if necessary, be tailored to provide protection for the ends of the plugs during the etching process, e.g. to prevent or reduce the effects of chemicals attacking material in the exposed ends of the plugs 25, e.g. ends 34a, 34b, (FIG. 8).

I. Conductive Material

Figure 9:
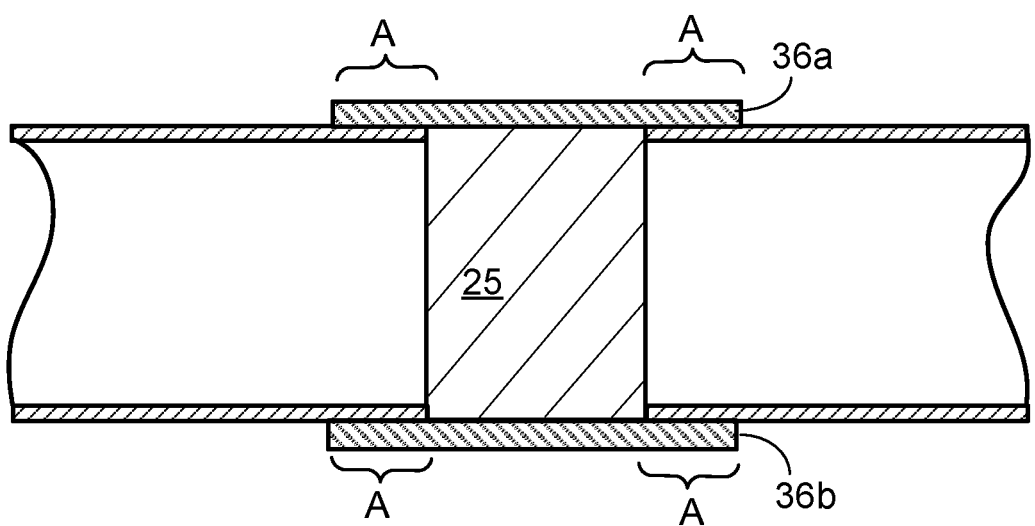
FIG. 9 is a cross-sectional view through the hole in the substrate showing the magnetically permeable material covered by masks at the ends of the hole.
Figure 10A:
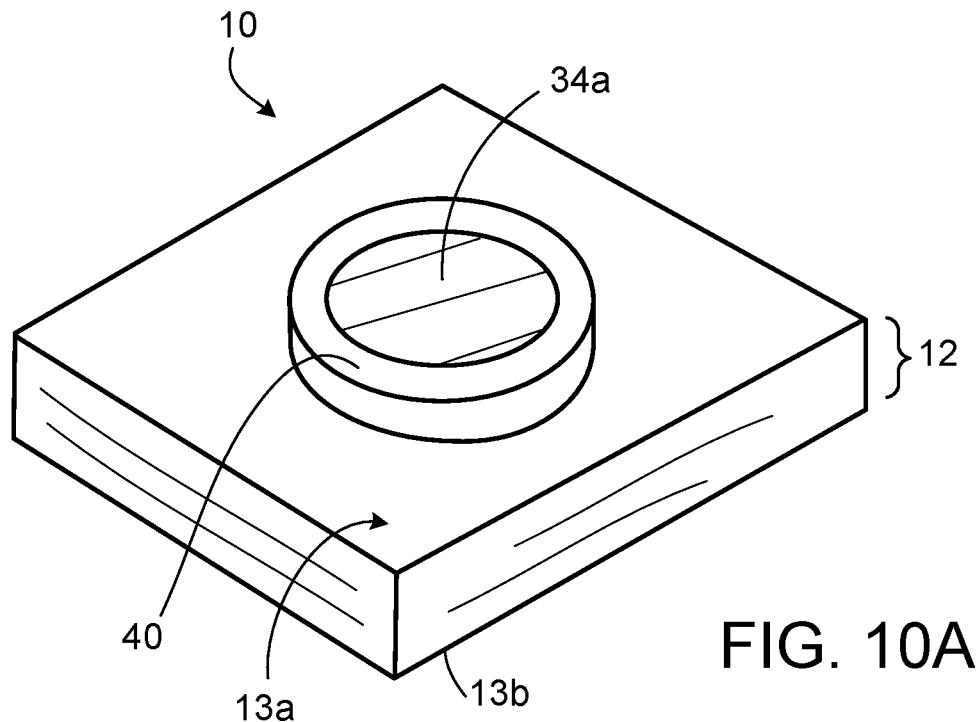
FIG. 10A is a perspective view of the hole in the substrate filled with the compressed magnetically permeable material, showing a conductive ring around the ends of the hole.
Figure 10B:
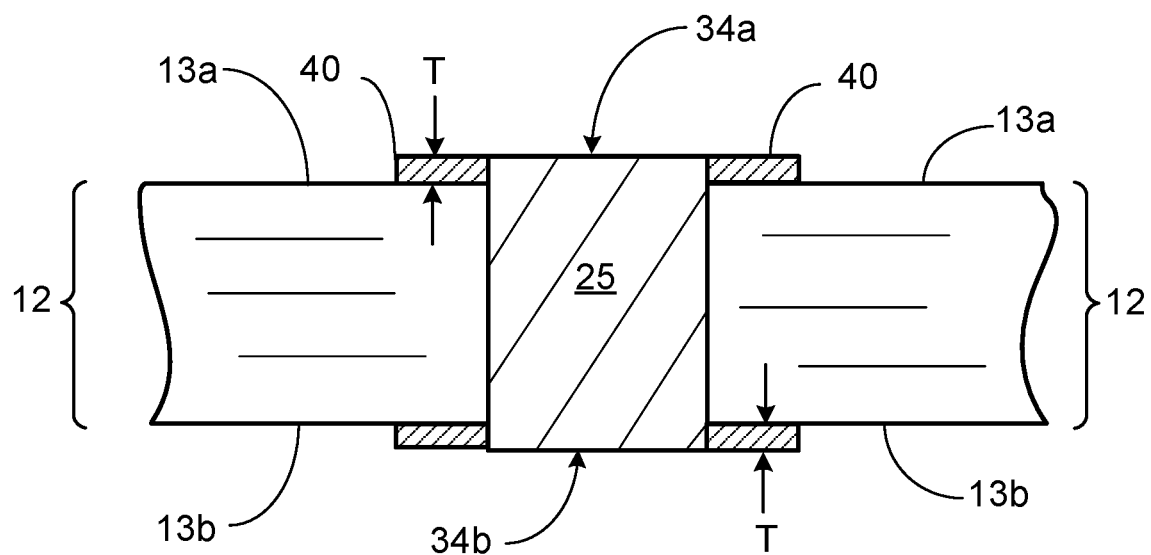
FIG. 10B is a cross-sectional view through the hole in the substrate filled with the compressed magnetically permeable material and conductive ring around the ends of the hole of FIG. 10A.

A first process for protecting the plugs 25 will be described with reference to FIGS. 9 through 12. As shown in FIG. 9, a protective mask, 36a, 36b, may be applied over the ends of the plugs 25 prior to etching to protect the plugs and further may be used to define a region of conductive material around the plug (e.g. region A, FIG. 9) which may remain after the etching process. During etching, the masks over the ends of a plug, and the conductive material surrounding the ends of the plugs (i.e. the conductive material in masked region A, FIG. 9), protect the plug and the masked portion of the conductive material from the etching process. FIG. 10A shows a perspective view of a region of the PCB around the hole after etching and after mask removal. FIG. 10B shows a cross-section through the region shown in FIG. 10A. As illustrated, using masks, 36a, 36b (FIG. 9) the etching step 340 yields a ring of conductive material 40 that surrounds, and is coplanar with, the ends 34a, 34b (FIG. 10B) of the plug 25. The ring of conductive material 40 may function as a spacer. The region of conductive material 40 of FIGS. 10A and 10B must be either removed or notched to interrupt the conductive ring prior to installation of the magnetic plates to prevent formation of a shorted turn around the resulting core leg.

Figure 11A:
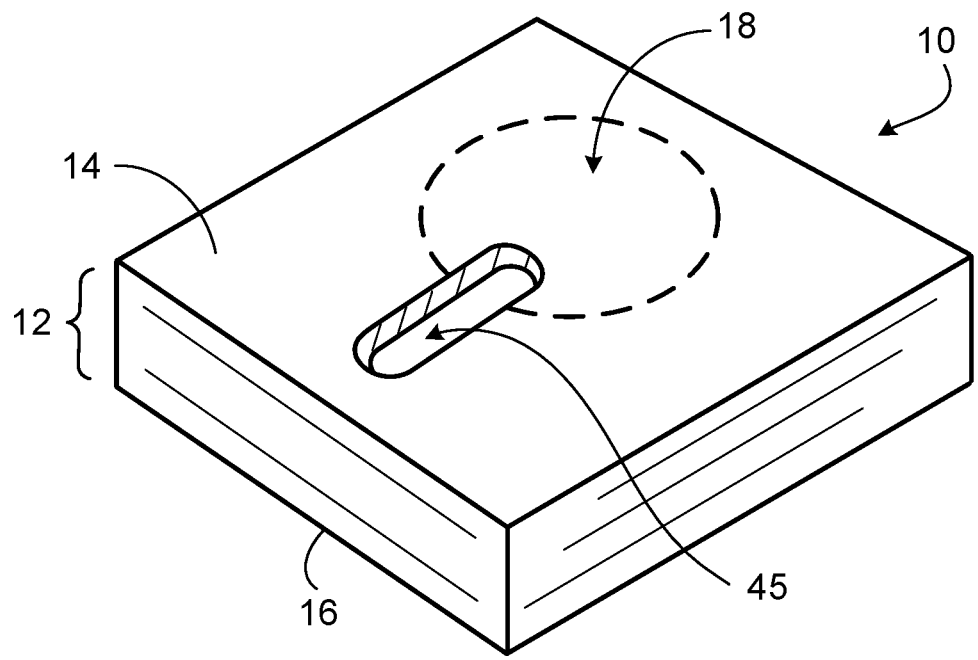
FIG. 11A is a perspective view of a portion of a substrate showing a notch formed through a conductive layer on the surface of the substrate prior to formation of the ring.
Figure 11B:
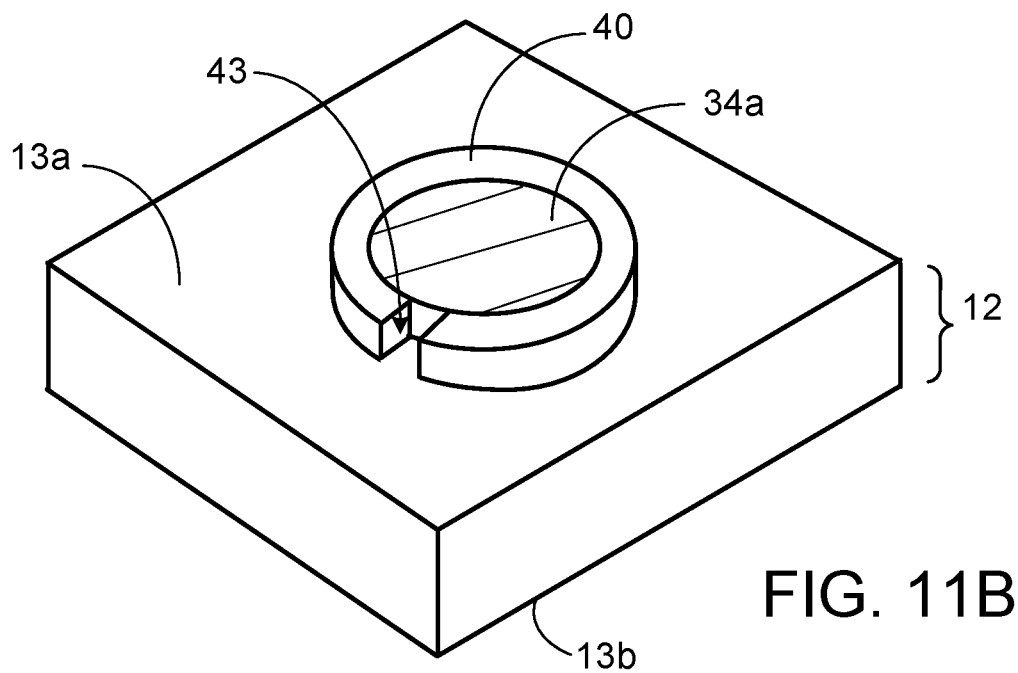
FIG. 11B is a perspective view of the portion of the substrate shown in FIG. 11A after further processing to form the conductive ring showing a slot in the conductive ring to prevent formation of a shorted turn around the magnetically permeable material in the hole.

If the conductive spacer ring is to remain, one way to avoid a shorted turn, as illustrated in FIG. 11A, is to provide a notch 45 in the top and bottom outermost conductive layers of the PCB at each hole location 18 (FIGS. 4, 11A) prior to application of the mask 36a, 36b (FIG. 9) and etching (step 340, FIG. 3). The notch may be formed, e.g., by routing, preferably before or during the hole drilling step (220, FIG. 3). As illustrated in FIG. 11B, the notched region will result in a slot 43 in region 40, thereby interrupting the continuity of the ring and preventing formation of a shorted turn. Preferably, the notches 45 may be filled with a material, e.g. a thermoset polyimide, that is resistant to etching chemicals used in step 340 to prevent etching chemicals from seeping under the masks 36a, 36b, in what would otherwise be the unfilled notch. Filling of the notches may be done by use of a stencil having openings aligned with the notches and print, inject, squeegee, or otherwise dispense the material into the notches.

FIG. 12 shows a modification to a portion of the method of FIG. 3 to include the additional steps of adding the notches, step 205, and filling the notches with a protective material, step 207. As shown in FIG. 12, the notches may preferably be formed (205; FIG. 12) and filled (207; FIG. 12) before the holes are drilled (220; FIG. 12), e.g. to avoid any debris from partially or completely obstructing or filling any of the holes.

II. Non-Conductive Material

Figure 15:
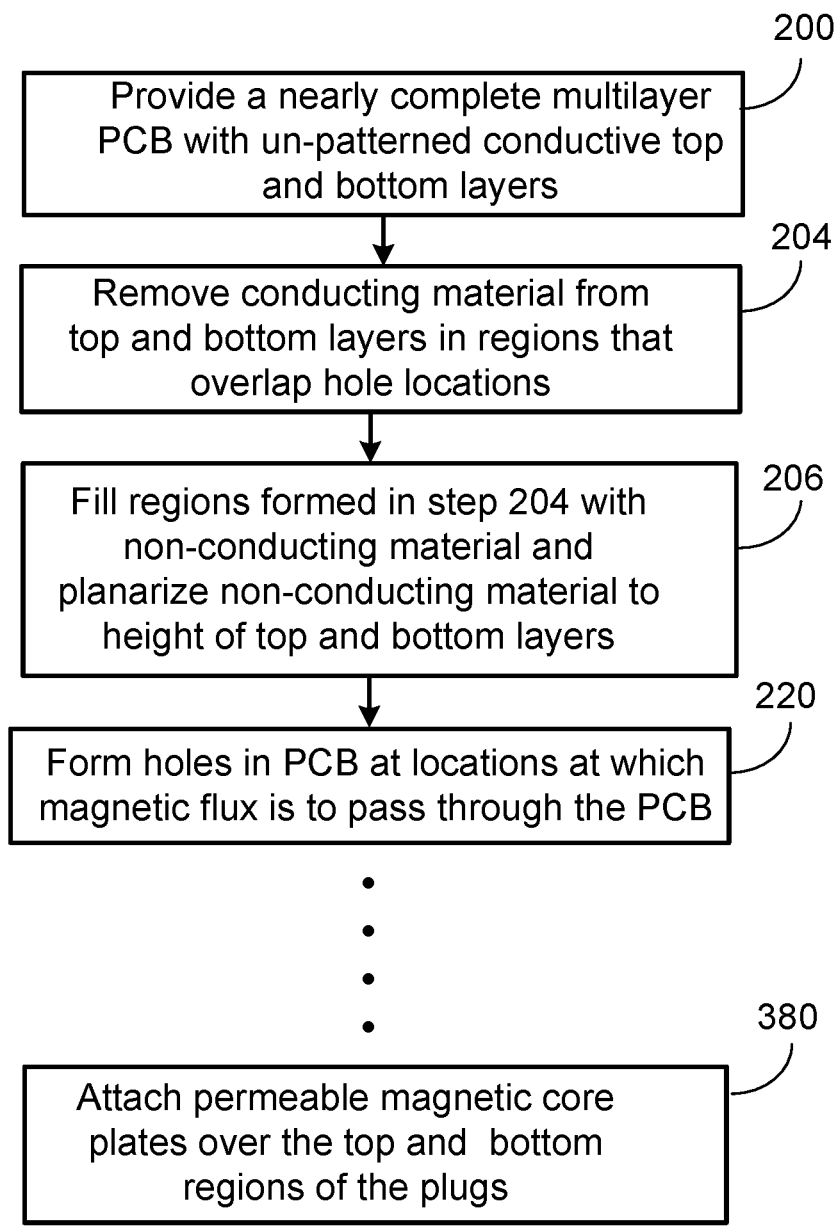
FIG. 15 shows steps in a method for making a planar inductive device according to the invention.
Figure 16:
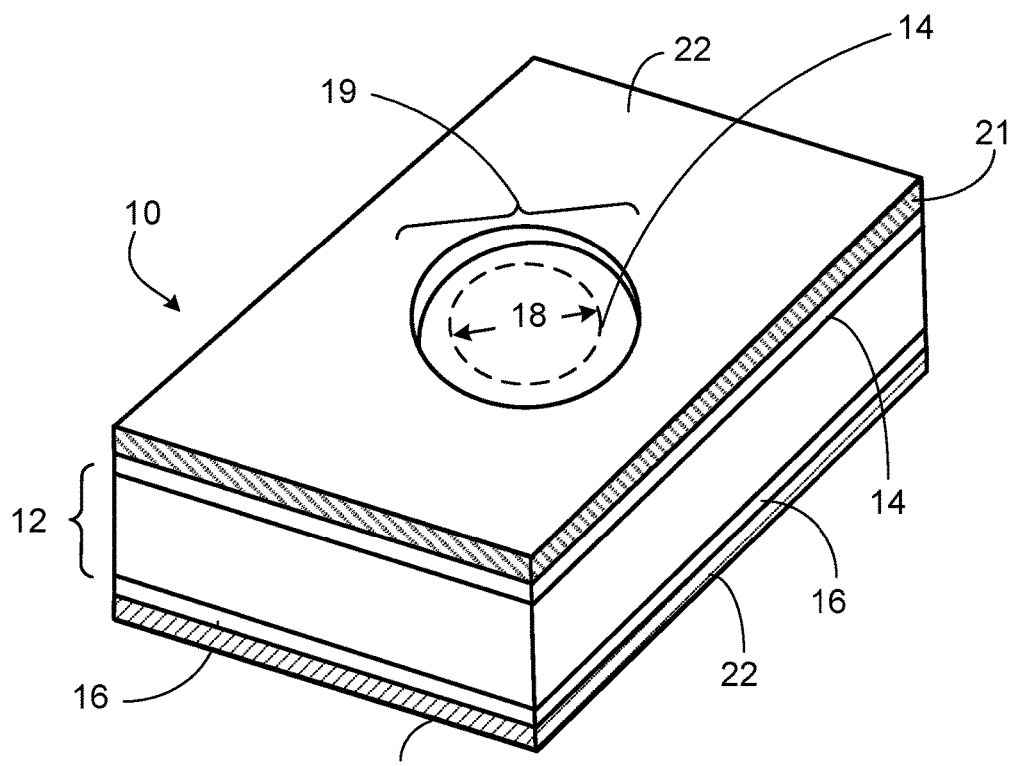
FIG. 16 is a perspective view of a portion of a substrate showing a mask.
Figure 17:
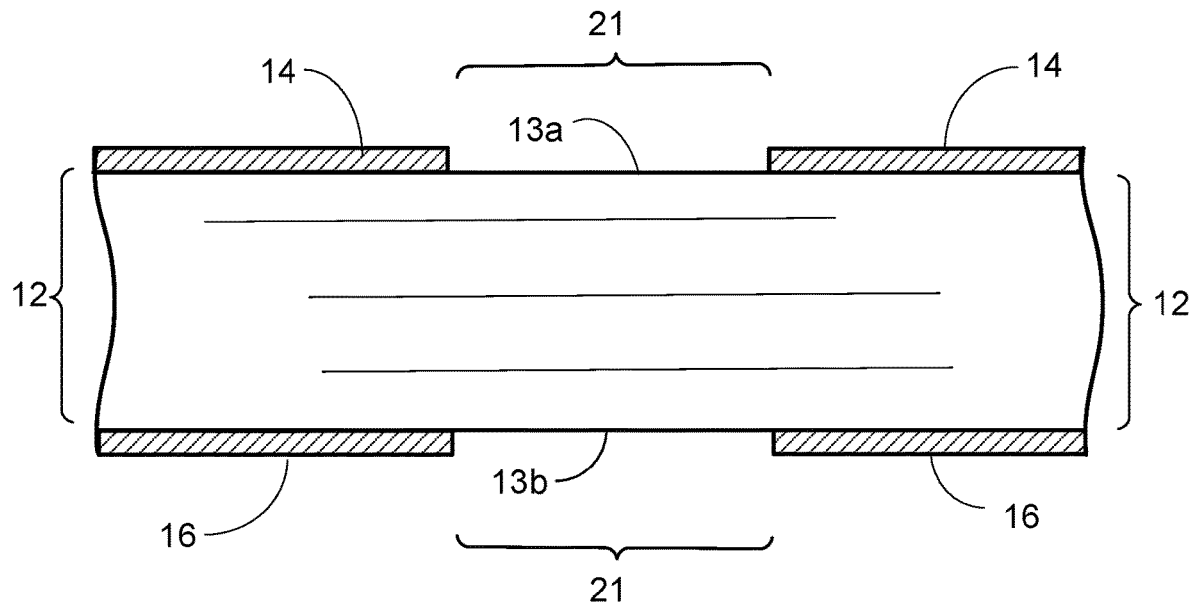
FIG. 17 is a cross-sectional view through the substrate of FIG. 11 showing regions of conductive material and the mask removed, e.g. by etching, chemical removal, or other means, e.g. etched regions.
Figure 18:
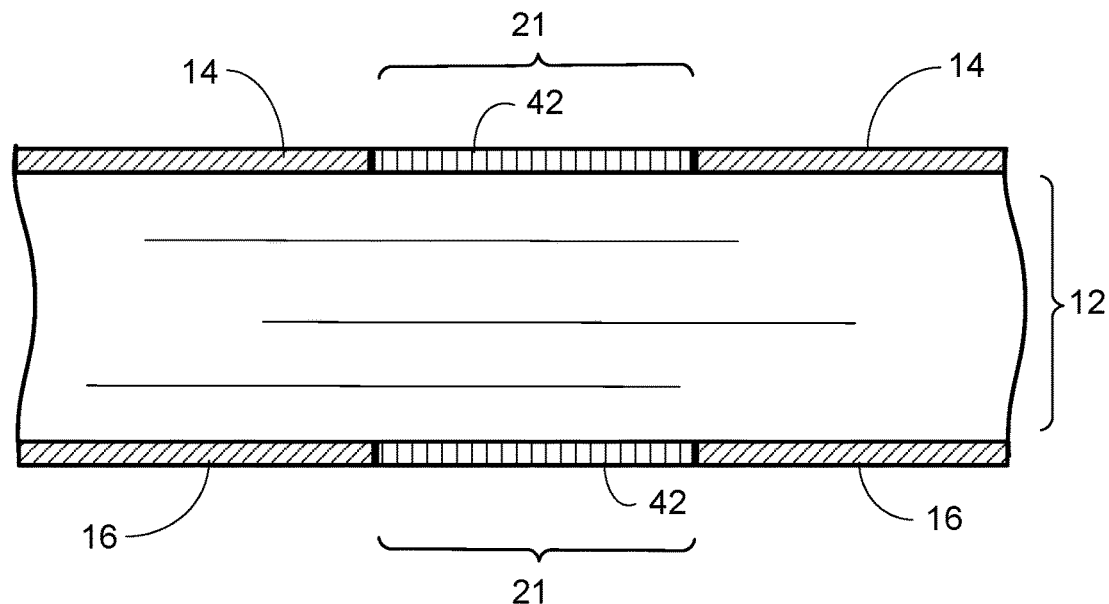
FIG. 18 is a cross-sectional view of the substrate of FIG. 17 showing the etched regions filled with non-conductive material.
Figure 19:
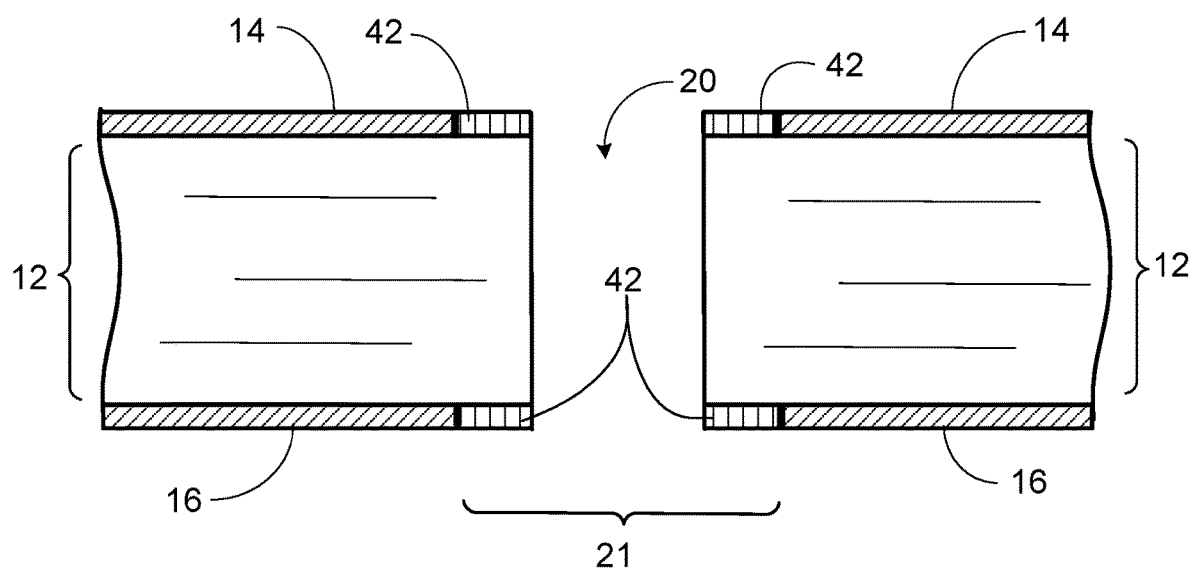
FIG. 19 is a cross-sectional view of the substrate of FIG. 18 showing a hole formed in the substrate.
Figure 20:
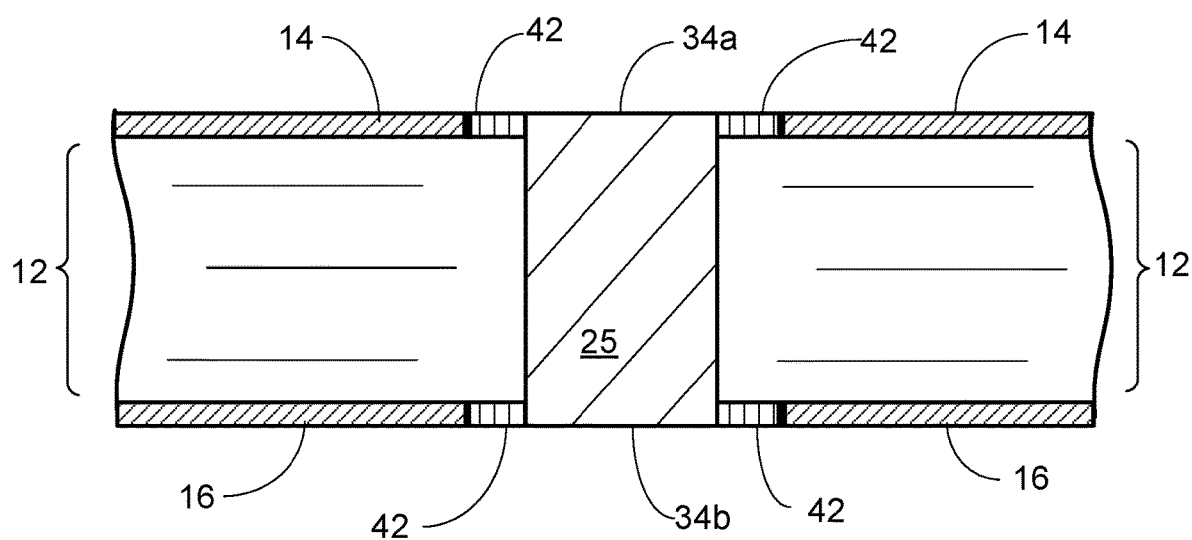
FIG. 20 is a cross-sectional view of the substrate shown in FIG. 19 showing a magnetically permeable plug formed in the hole.

A second alternative method for protecting the plugs during etching, may use a non-conducting ring of material around the ends of plug 25 instead of the conductive ring described above. This second alternative method may preferably begin following step 200 (FIG. 3) but before the holes are formed in the PCB at hole locations 18 in Step 220 (FIG. 3) as shown in the process flow of FIG. 15 with the addition of steps 204, and 206. Conductive material may be removed in step 204 (FIG. 15) from the outer layers 14, 16 at regions that overlap each hole location 18, e.g. by etching. As shown in the perspective view of FIG. 16, a portion of PCB 10 may be selectively covered with mask 22 on the top and bottom surfaces of the PCB, leaving regions 19 overlapping the hole locations 18 (dashed circle in FIG. 16) free of mask 22. The conductive material in the regions 19 on the top and bottom layers may be etched away, after which the masking material may be removed. The cross-section of FIG. 17 shows the outermost PCB insulations 13a, 13b exposed in regions 21 (corresponding to the mask-free regions 19, FIG. 16), i.e. free of the conductive material after etching and mask removal. The regions 21 may be subsequently filled with a non-conductive material 42, e.g., a drillable epoxy, which may be cured and planarized to the height of the surrounding conductive material 14, 16 as described in step 206 (FIG. 15) and illustrated in the cross section of FIG. 18. Filling of the regions 21 may be done by use of a stencil having openings aligned with the regions and print, inject, squeegee, or otherwise dispense the material into the notches. The second alternative method continues with the drilling step 220 (FIG. 3) described above. The cross-section of FIG. 19 shows a hole 20 drilled at a location 18 in step 220 (FIG. 3) leaving a ring of non-conductive material 42, coplanar with outer surfaces of outer layers 14, 16, surrounding the hole 20. The method may then continue with steps 240 through 320 (FIG. 3) as described above and yielding the structure at a location 21 illustrated in cross-section in FIG. 20 after the planarization step 320 (FIG. 3). As shown in FIG. 20, a cured magnetic plug 25 has top and bottom surfaces 34*a*, 34*b* that are coplanar with top and bottom outer surfaces of non-conducive material 42 which is also coplanar with conductive layers 14, 16.

Figure 21:
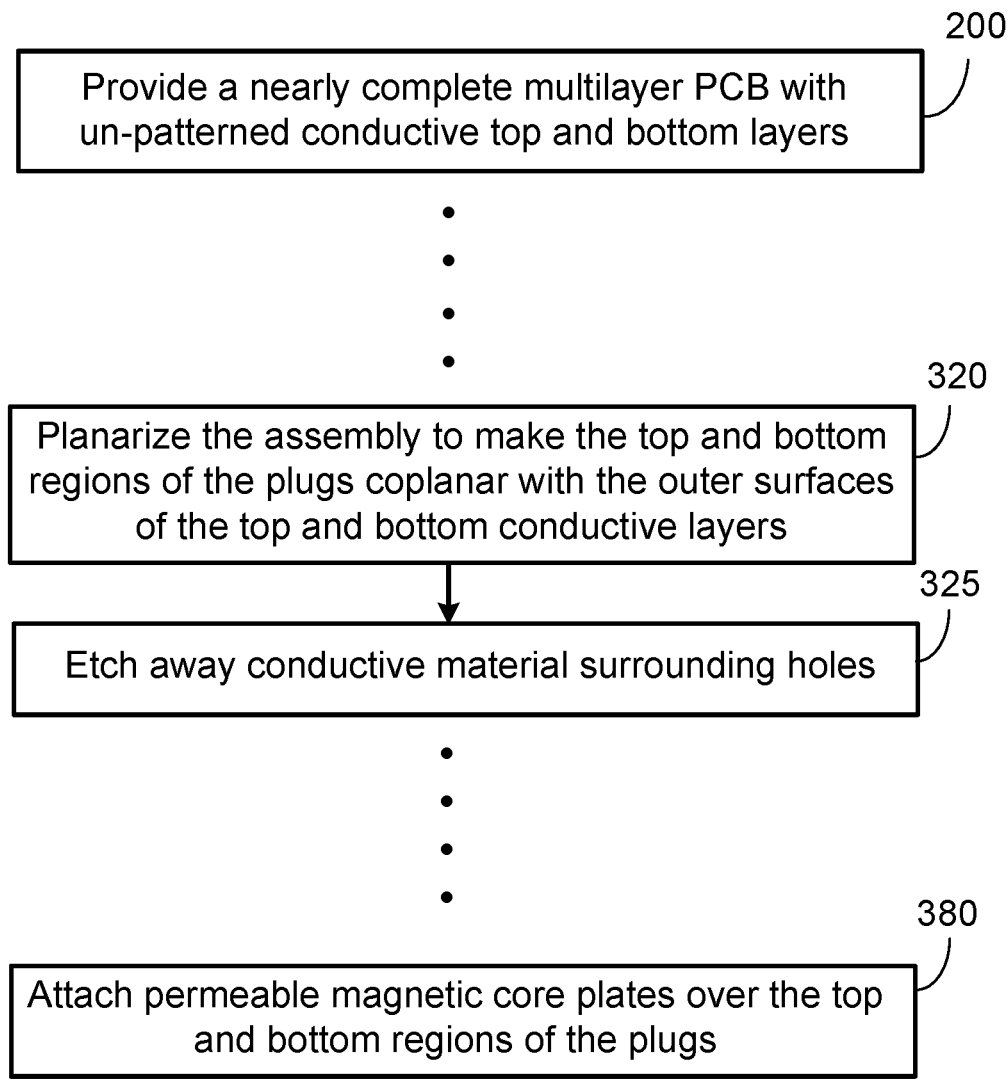
FIG. 21 shows steps in a method for making a planar magnetic device according to the invention.

The above methods may optionally include an additional etching step 325 following step 320, to remove conductive material on the outer layers of the PCB, including in regions around the plugs if desired, as described in the process flow of FIG. 21. For plugs surrounded by conducting material (e.g., as shown in FIG. 10), an alkaline etching process may preferably be used because acidic etching chemistry may adversely affect the exposed ends of the plug 25, e.g. by attacking iron particles in the magnetically permeable material. A mask may be applied, preferably selectively, to the top and bottom surfaces of the PCB, leaving conductive regions 40 (FIG. 10B, 11B) unmasked. The conductive regions 40 may then be either fully etched away, as shown in FIG. 22A, or partially etched away, as shown in FIG. 22B, resulting in the ends of the plug 25 extending above the PCB surface or the remaining portion of the conductive region 40, respectively. For plugs 25 surrounded by non-conducting material (e.g., as shown in FIG. 20), a mask may be applied, preferably selectively, to the top and bottom surfaces of the PCB, leaving portions of conductive regions outside of the ring of non-conducting material unmasked. The ends of plugs, 34*a*, 34*b*, surrounded by the non-conductive rings may also be masked, allowing an acid chemical etchant to be used, since the non-conducting ring 42 will protect the edges of the plug from etching chemicals. The resulting configuration after etching and after removal of the masks is shown in FIG. 22C.

The preceding discussion of step 340 (FIG. 3) assumed that it is desirable or necessary to protect the ends of the magnetic plugs 25 during the etching process (e.g. using the conductive ring (notched & filled or unnotched), or the non-conductive ring of material, used around the holes during formation of the plugs). One way that may avoid a need to protect the plugs from the etching chemistry is to use alkaline etching chemicals instead of acidic etching chemicals. Alkaline etching, however, may be slower than acidic etching. Another way to avoid the need for protecting the plugs is to use a paste/slurry material comprising magnetic powder and binder polymer that is, or is rendered, impervious to etching chemistry (e.g. magnetic powders made of oxides of silicon; binders comprising thermoset polyimide).

Referring to steps 360 in FIG. 3, additional circuit components may be assembled onto the outer surfaces of the PCB. In one example, electronic components may be combined with the magnetic circuit to form switching power conversion circuitry.

Figure 13:
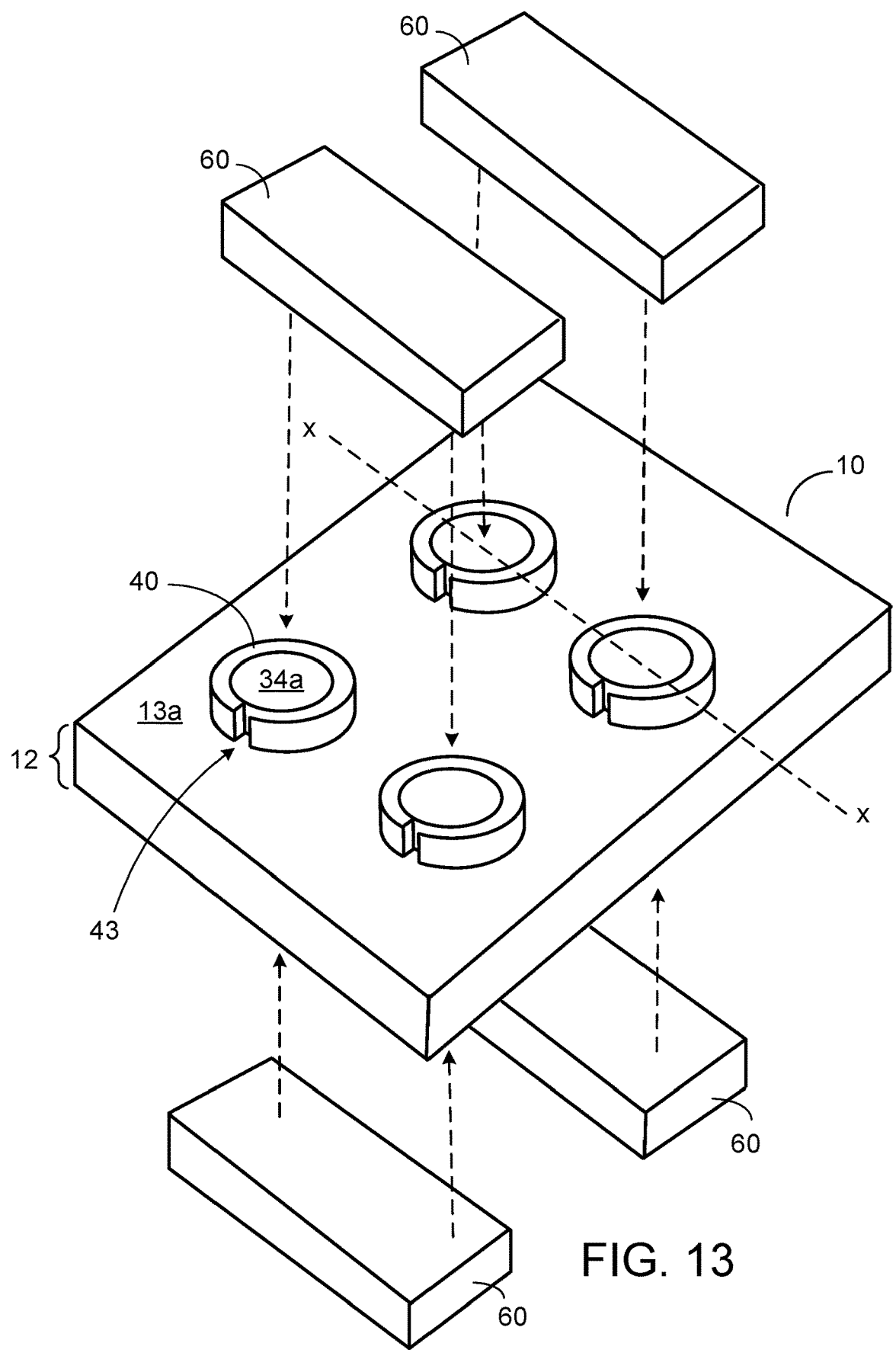
FIG. 13 is an exploded perspective view of a portion of an electronic assembly comprising an inductive device according to the invention.
Figure 14:
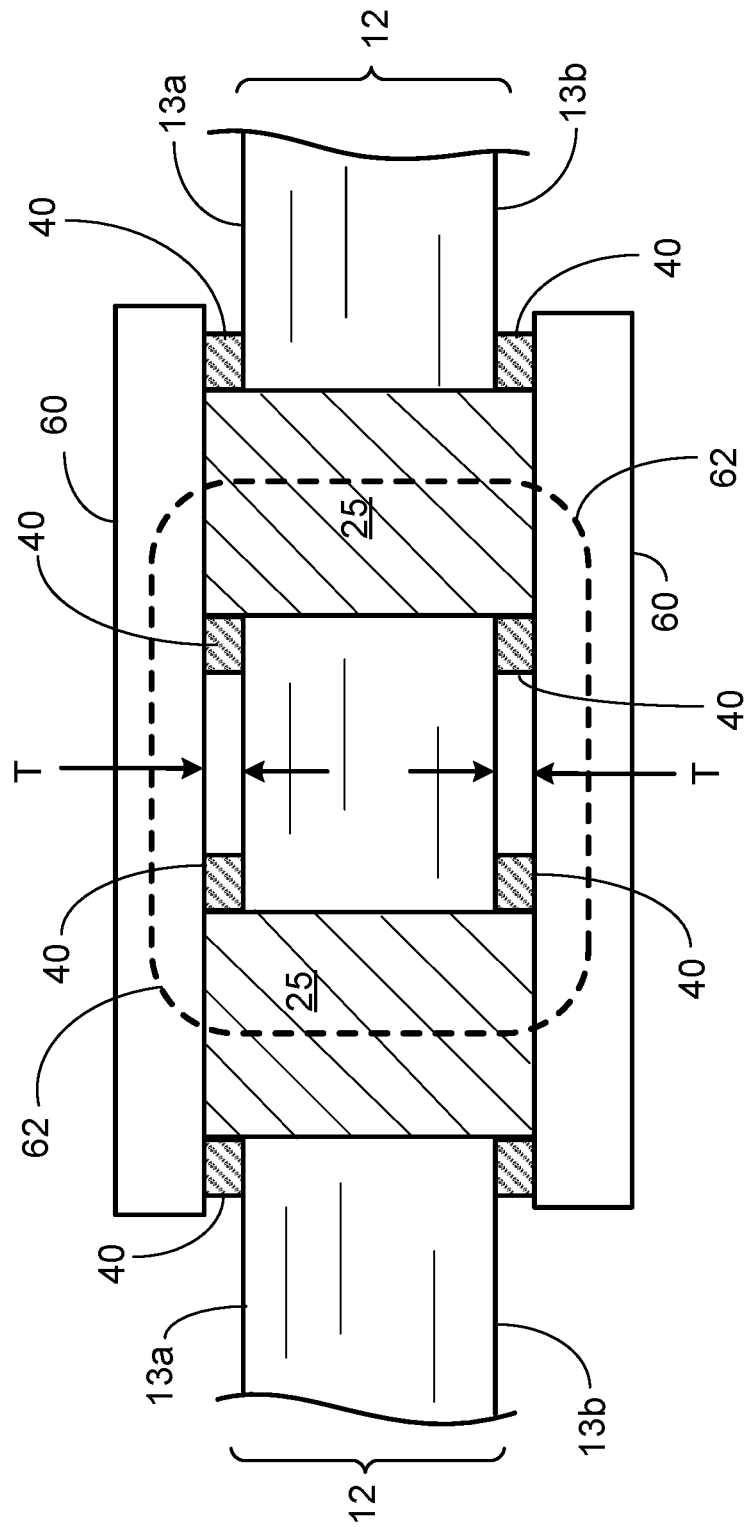
FIG. 14 is a cross-sectional view through a portion of the assembly of FIG. 13.

In step 380 (FIG. 3) magnetic core plates 60 may be attached to the ends 34*a*, 34*b* of plugs 25 on the top and bottom of PCB 10. FIG. 13 shows a portion of a PCB 10 during step 380 in which notched conductive rings described above have been used. As shown in FIG. 14, which is a cross-section through section X-X in FIG. 13, two core pieces 60 and two plugs 25 are shown to form a closed magnetic circuit (indicated by the dashed flux path 62) without gaps FIGS. 23A and 23B respectively show perspective and cross-sectional views of a magnetic circuit formed by two core plates and three plugs, in which the rings 40 have been removed. Because the cured paste/slurry may be a mixture of magnetically permeable powder and non-magnetic binder, small gaps between particles of permeable powder may naturally form, and be distributed throughout the plugs, lowering the effective relative permeability of the plugs, potentially making additional gapping unnecessary or undesirable in some applications. However, additional gaps may be desirable for manufacturing a mixture of products using standardized materials as described below.

The effective permeability of a simple magnetic circuit, having a magnetic path length through a permeable core, $L_{core}$, having a uniform cross-section and relative permeability, $\mu_{r\text{-}core}$, and including a small air gap having a gap length, $L_{gap}$, where $L_{gap} \ll L_{core}$, is generally dominated by the gap length as shown by the following approximation:

$$\mu_{r\text{-}eff} \approx \frac{\mu_{r\text{-}core}}{\frac{L_{gap}}{L_{core}} * \mu_{r\text{-}core} + 1}$$

The preferred embodiment may use ferrite core plates, which may have a relative permeability, $\mu_{r\text{-}plates}$, of approximately 900 to 1000 and a larger cross-sectional area (than the plugs), with the pasted core plugs, which may have a relative permeability, $\mu_{r\text{-}plug}$, of 20-40 (as described below). The combination of different relative permeabilities and cross sectional areas complicates the expression, however, taken together the higher relative permeability and cross-sectional area of the ferrite plates represent at least an order of magnitude difference in reluctance, allowing the core plates to be ignored for a first order approximation of the effective permeability of the magnetic circuit, thus allowing the above approximation to be used. As can be seen, ignoring the ferrite plates reduces the effective permeability to a simple function of the ratio of gap length to plug length and relative permeability of the plug. $\mu_{r\text{-}plug}$:

$$\mu_{r\text{-}eff} \approx \frac{\mu_{r\text{-}plug}}{\frac{L_{gap}}{L_{plug}} * \mu_{r\text{-}plug} + 1}$$

As indicated by the above approximation, introducing a small "air" gap at one or both ends of each plug may be used to control the effective permeability of the magnetic circuit, without altering the relative permeability of the core material itself. Such adjustments may be useful for controlling the magnetizing inductance of a transformer formed using the planar core plate and pasted-plug magnetic structure on a manufacturing line having a high product mix requiring different effective permeabilities. For example, using a relative permeability of 30 for the plugs: a total gap that is 0.5%, 1%, 5%, or 10% of the plug length may be used to set the effective permeability of the magnetic circuit to 26, 23, 12, or 7.5, respectively. Assuming a PCB thickness of 30 mils, the above gap percentages of 0.5%, 1%. 5%, or 10% yield gaps between the core plates and plugs at each end of 0.075, 0.15, 0.71, and 1.37 mils, respectively. Thus, the effective permeability may be customized as needed for each application by setting an appropriate gap, which may include recessing the ends of the plugs below the PCB surface, e.g.

recess 61 (FIG. 25) or using other features of the PCB to set the appropriate gap as discussed below in connection with FIGS. 25 and 26A through 26E.

The core pieces may be attached in a variety of ways. Where no additional gap between the plugs and plates is desired, the plates may be attached to the outermost PCB surfaces, e.g., by depositing adhesive between each core plate and the PCB outermost surface, preferably using a structural adhesive, and preferably avoiding the ends of the plugs. For example, the adhesive may be deposited around the periphery of the plugs. Alternatively, a permeable paste adhesive, e.g. an adhesive containing particulate magnetically permeable material, may be deposited between the plugs and the plates to avoid creating air gaps. If a gap between the core pieces and plugs is desired, the adhesive may be applied on the ends of the plugs. It should be noted that the outermost surface of the PCB in the region beneath the core plates may be the insulation layer, e.g. 13a, or the conductive layers, e.g. 14, 16, or the rings or spacers created in the above described process depending on the configuration used.

The outermost conductive layers of the PCB in the region beneath the core plates may be used to control the distance between the core plates and the plug ends, i.e. the gaps. In the cross section of FIG. 14, the core plates, 60, are shown resting on the conductive rings 40 (which as described above may be formed in the outermost conductive layers, e.g. copper layers, of the PCB). The thickness of the conductive rings may be varied to control the height of the plug ends relative to the surface of the PCB beneath the core plates, preferably before assembly of the plates to the PCB. For example, the conductive rings may be etched to partially or completely remove the rings leaving the plugs proud of the remaining material.

Figure 26A:
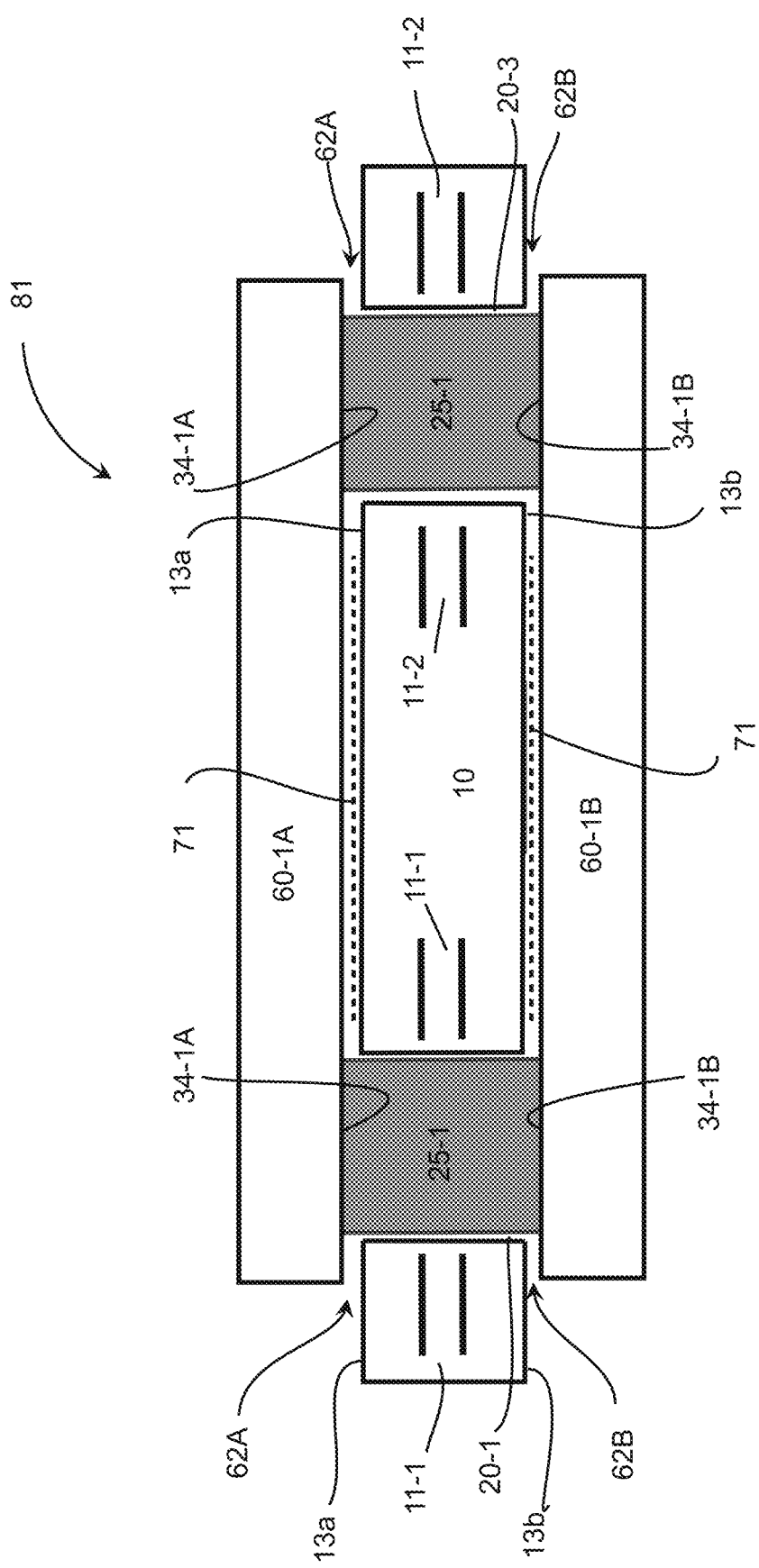
FIGS. 26A, 26B, 26C, 26D and 26E are cross-sectional views through planar inductive devices.

Referring to FIG. 26A, a cross section of a preferred magnetic circuit, 81, is shown having a top core plate 60-1A and bottom core plate 60-1B magnetically connected by a pair of magnetic core legs 25-1. A PCB 10 includes a plurality of windings, e.g. 11-1 and 11-2, which may be formed in one or more conductive layers 12 in the PCB 10. Each winding 11 may surround a respective one or more of the core legs, 25-1. As shown the core plates, 60-1A, 60-1B, rest on the ends, 34-1A, 34-1B, of the core legs without any appreciable gaps. A structural adhesive, 71, may be used to hold the core plates in place in contact with the core legs as shown. Note that the core legs 25-1 are shown slightly proud of the PCB surfaces, e.g. plug ends 34-1A are proud of top surface 13a, to ensure contact between the legs and the core plates. As shown, in the example of FIG. 26A the rings have been removed, which is one way to leave the plug ends proud of the PCB surface, e.g. insulation layer outermost surface 13a. Also, all of the conductive material on the outermost surfaces of the PCB, e.g. in layers 14 and 16 (FIGS. 4 and 5), in the footprint below the core plates has been removed leaving only the insulation layer surfaces, 13a, 13b exposed. As shown the adhesive 71 may be deposited on the PCB surfaces 13a, 13b, below the core plates to secure the core plates 60 to the PCB while resting on the core plugs for no gap.

Figure 26B:
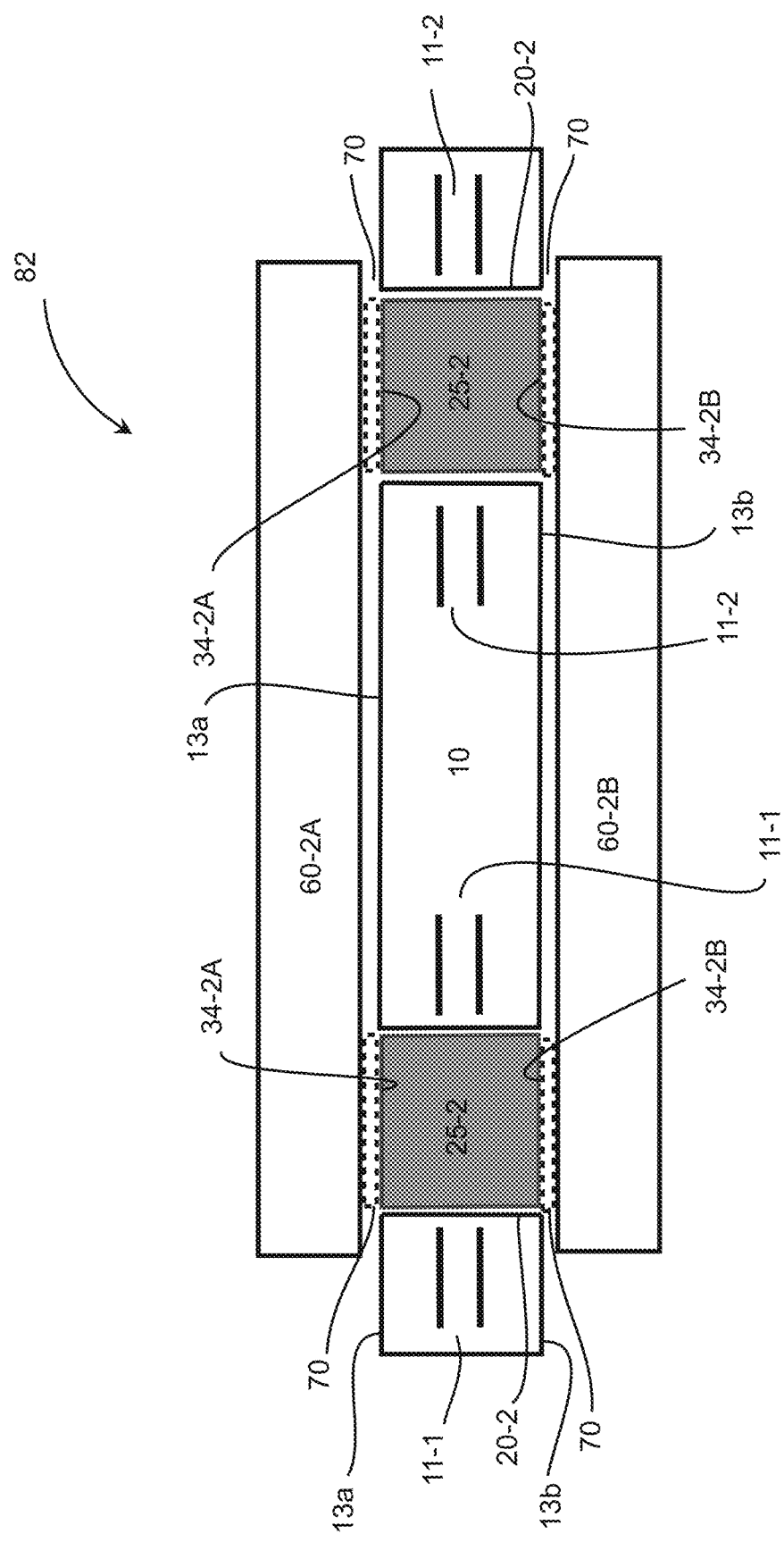

FIG. 26B shows an alternate magnetic circuit 82 in cross section including a top core plate 60-2A and bottom core plate 60-2B magnetically connected by a pair of magnetic core legs, i.e. plugs 25-2. The PCB 10 includes a plurality of windings 11-1 and 11-2, which may be formed in one or more conductive layers 12 in the PCB 10. In the embodiment of FIG. 26B, an adhesive, 70, may be used between the core plates and the plugs to hold the core plates in place.

Preferably, the adhesive is a structural adhesive. Note that the ends 34-2A, 34-2B, of plugs 25-2 in FIG. 26B are shown essentially coplanar with the PCB surfaces 13a, 13b. The adhesive 70 may be used as part of a predetermined "air" gap between the plates and the legs, i.e. a gap in the magnetic circuit having a relative magnetic permeability that is much lower than the core material in the rest of the magnetic circuit, e.g. $\mu_{r\text{-}adhesive} \ll \mu_{r\text{-}plates}$ or $\mu_{r\text{-}legs}$. Alternatively, magnetically permeable material, preferably particulate magnetically permeable material, may be mixed with the adhesive 70 to provide the gap with a relative permeability that is greater than air, e.g. to keep the effective permeability of the magnetic circuit at an acceptably high value. As used herein, an essentially coplanar plug end refers to a plug end that is less than 15 microns proud of surrounding PCB features, e.g. PCB features located within the footprint of the core plates. More preferably, the plug ends may be within 12 microns, 10 microns or less of the surrounding PCB features. Alternatively, an essentially coplanar plug end may be defined as the ratio of the length of any gap created by the difference in height between the plug end and the surrounding PCB features being less than 1.5%, or preferably less than 1%, or more preferably less than 0.5% of the plug length. Alternatively, coplanarity may be measured in terms of effective permeability of the plug and gap, e.g. an essentially coplanar plug has an effective permeability (including any gap introduced by an error in coplanarity) that is within 50% of the relative permeability of the plug (without any gaps at its ends), and more preferably within 75%, and most preferably within 80% of the relative permeability.

As described above, the plugs may be planarized to achieve the desired height. As shown in the example of FIG. 26B, the rings 40 have been removed and the plug ends are coplanar with the PCB surface, e.g. insulation layer outermost surfaces 13a, 13b. One way to achieve the result shown is to planarize with the rings in place and then reduce or remove the rings, e.g. by etching leaving the plugs proud. Also, the conductive material on the outermost surfaces of the PCB, e.g. layers 14 and 16 (FIGS. 4 and 5), in the footprint below the core plates has been removed leaving only the insulation layer surfaces, 13a, 13b exposed beneath the core plates.

Figure 26C:
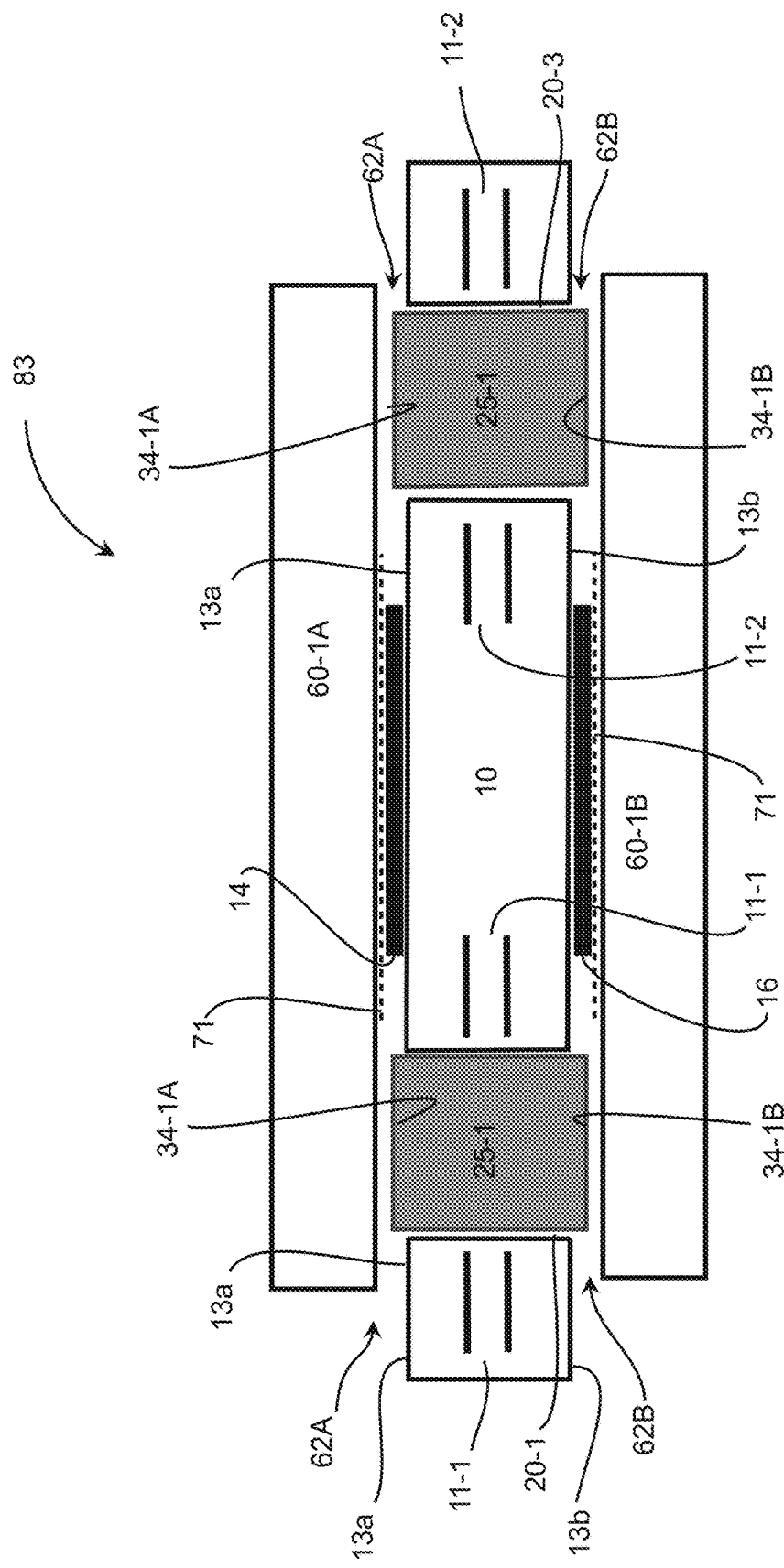

Another magnetic circuit 83 is shown in FIG. 26C having the conductive rings 40 removed, preferably after planarization, with the plug ends proud of the outermost insulation layers 13a, 13b. However, unlike the previous examples of FIGS. 26A and 26B, features formed in the outermost conductive layers 14 and 16 of the PCB remain in the footprints beneath the core plates acting as standoffs between the core plates 60-1A, 60-1B, and the ends of the plugs, 34-1A, 34-1B, even though the plugs are proud of the insulation layers 13a, 13b. As shown in the example 83 of FIG. 26C, adhesive 71 may be applied beneath the core plates which may then be pressed against the PCB allowing the adhesive to fill voids in the patterned conductive layers, i.e. between the insulation layers 13a, 13b and the core plates.

Figure 26D:
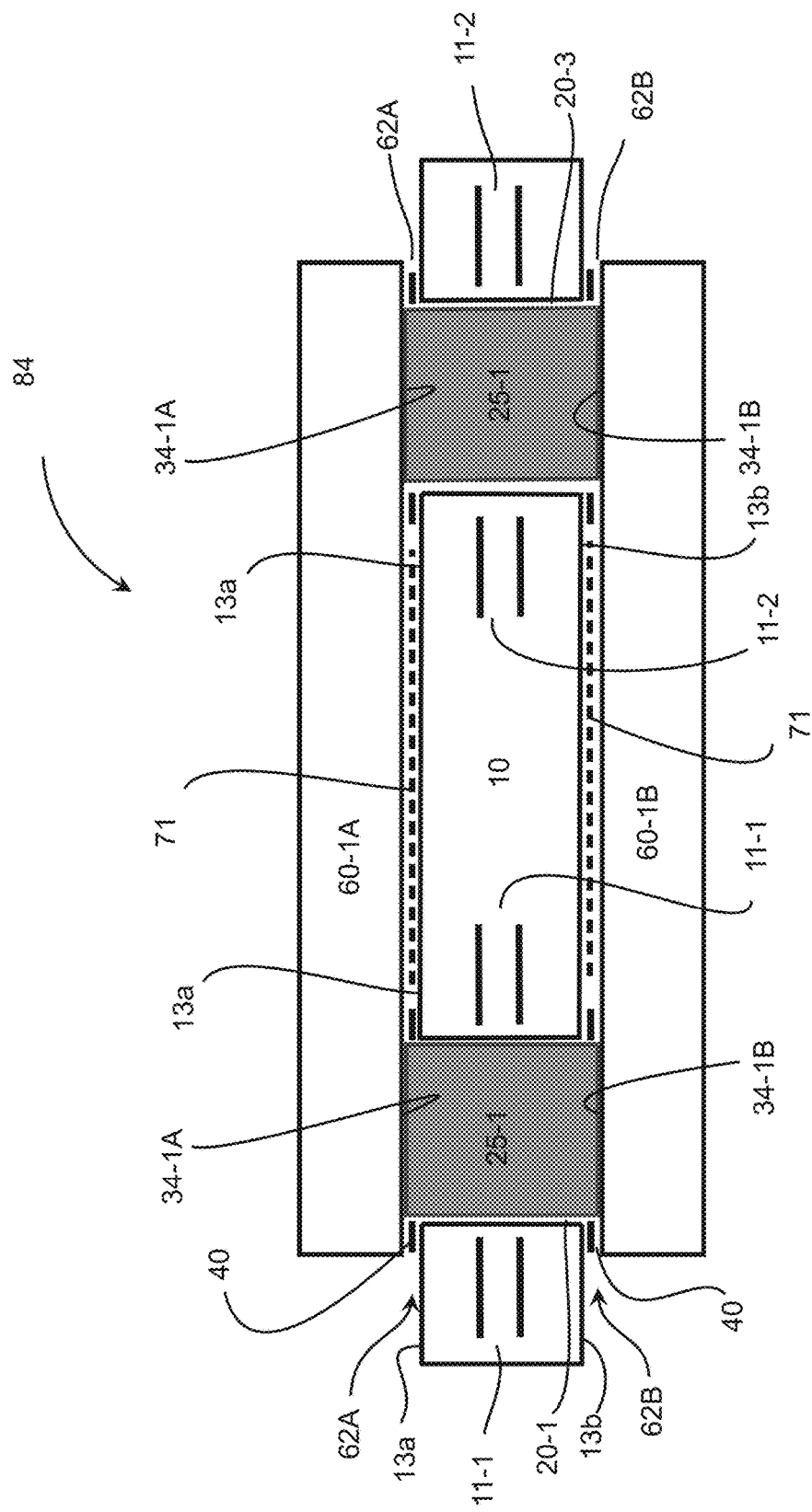

The magnetic circuit 84 is shown in FIG. 26D having some or all of the conductive rings 40 remaining in the final structure. As shown the core plates rest against the plug ends 34-1A and 34-1B, which are shown as slightly proud of the conductive rings 40. The plugs may be made proud of the rings, e.g. by partially etching the rings before assembly. Adhesive 71 had been dispensed in the regions between the core plates, 60-1A and 60-1B, and the PCB surfaces, in this case the insulation layers 13a and 13b since all of the conductive material, layers 14 and 16, in the footprint of the core plates has been removed. As shown, the adhesive has not been allowed to come between the plug ends and the core plates to ensure no "air" gap is formed by the adhesive.

Figure 26E:
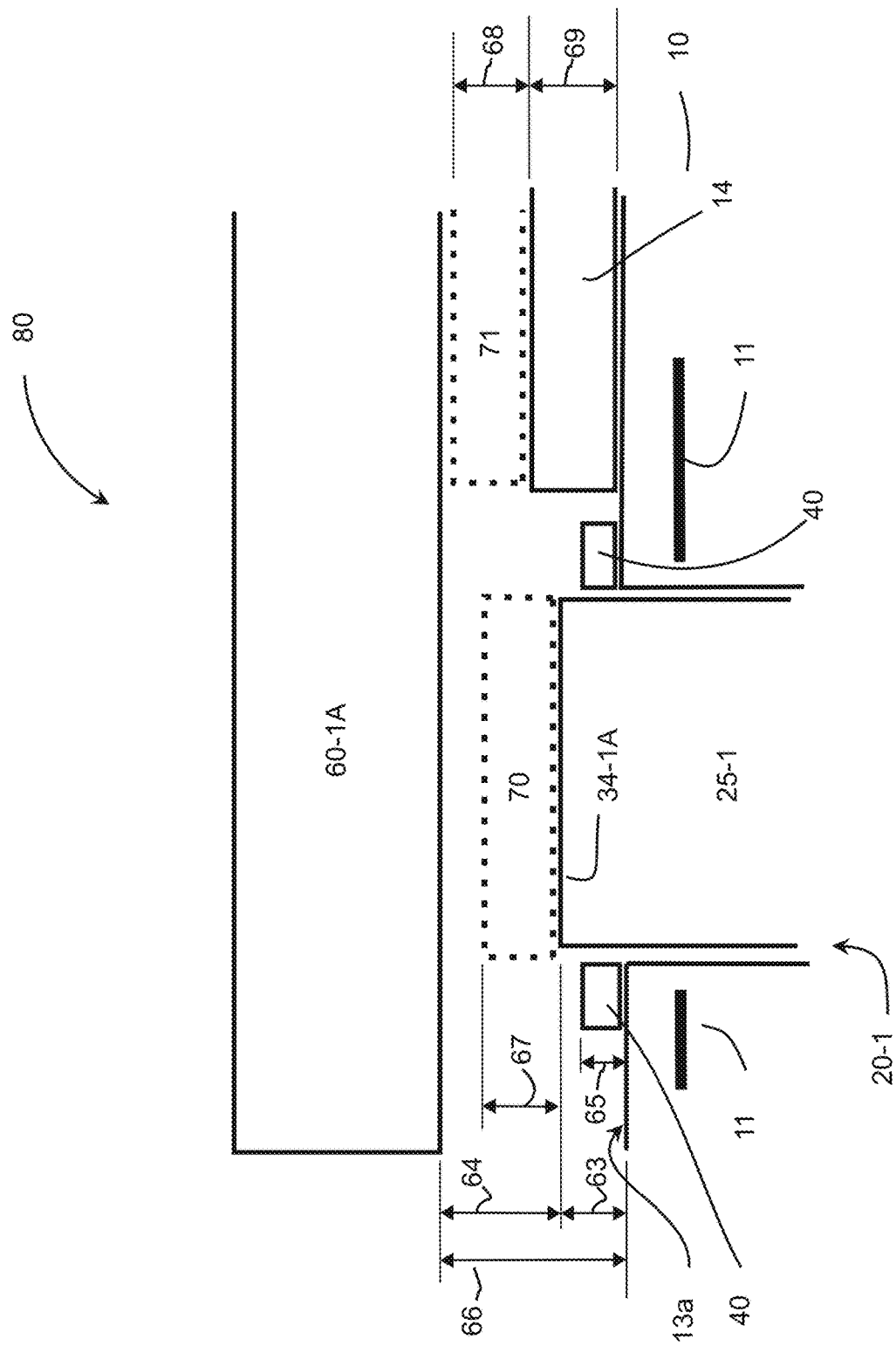

Referring to FIG. 26E, a portion of a magnetic circuit 80 is shown having several components, including windings 11 surrounding the plug 25-1. The end, 34-1A, of plug 25-1 is shown having an extension dimension 63 beyond the PCB insulation layer surface, 13*a*. Note that dimension 63 may be positive (proud) or negative (recess) as described above. The dimension 63 is also referred to as the distance between the end 34-1A of the plug 25-1 and the PCB insulation layer surface 13*a*. A conductive ring 40 is shown on the surface 13*a* around the hole 20-1, in which the plug 25-1 sits. The ring 40 has a height dimension 65 measured from the surface 13*a*. A feature in the conductive layer 14 is shown residing beneath the core plate 60-1A having a thickness 69 measured from surface 13*a*. An adhesive 70 is shown deposited on the end of the plug having a height 67 above the plug end. An adhesive 71 is shown deposited on the conductive layer 14 having a height 68 above the conductive feature. The gap between the core plate and plug end is shown as dimension 64 and the gap between core plate and the insulation layer 13*a* is shown as dimension 66. The components of the magnetic circuit may be varied to achieve the desired magnetic parameters. As described above, the rings may be removed, partially or completely, or may be built up, e.g. by plating, as required to produce plugs that are proud, coplanar, or recessed. Similarly, the conductive material in the footprint below the core plates may be removed partially, completely, or built up as desired relative to the plug ends or the rings to allow the core plates to rest on the plugs, the rings, on the conductive material which may function as standoffs, or on the PCB insulation layer. The ends of the plugs may be etched to recess them relative to other features or an adhesive, e.g. 70, with particulate magnetically permeable material may be used to fill any gaps between the plug ends and the core plates. Alternatively, the adhesive 70 may be used between the plugs and the plates to establish an "air" gap. Finally, adhesive 71 may be used to secure the plates to the PCB without creating a gap between the core plate and plug ends.

To summarize, the above process may be tailored to allow the core plates to rest on: (1) the plug ends (if proud of the PCB and any remaining rings or conductive material beneath the core plates); (2) the conductive layer beneath the core plate (provided any remaining rings are thinner than the conductive material beneath the core plates and the plugs are either coplanar with or recessed from the conductive material); or (3) on the insulation layer (provided no conductive material remains beneath the core plate and the plugs are either essentially coplanar with or recessed from the insulation layer).

Figure 24:
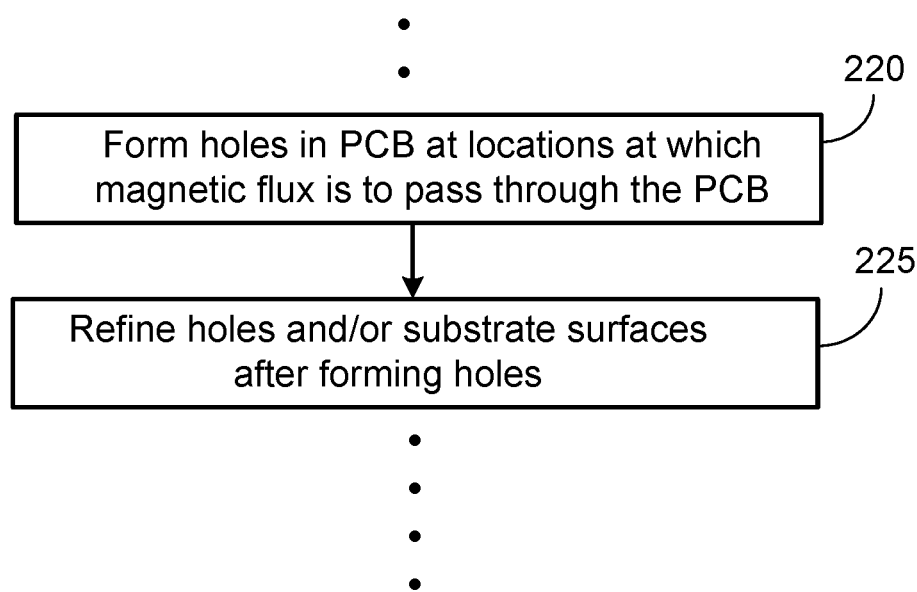
FIG. 24 shows steps in a method for making a planar inductive device according to the invention.

It is understood that the preceding description is not meant to provide an exhaustive description of every step used in processing a PCB. Additional processing steps, known in the art, may be used. For example, as illustrated in FIG. 24 an additional step 225 may be added in which holes and surfaces are refined after formation of holes in step 220. Refinement of holes and surfaces may for example comprise treatment with known etch methods to remove copper smear and enhance adhesion to surfaces.

In general, an inductive device according to the invention may form flux paths through a substrate by depositing a magnetic paste/slurry into a hole in the substrate and curing the paste/slurry to form a substantially solid magnetic plug. A uniform extension of the plug above an outer surface of the substrate may be provided by a spacer on the outer surface. The spacer may, e.g., be a conductive layer and/or a non-conductive material on the surface. Magnetically permeable plates, preferably spanning two or more plugs, may form a closed magnetic flux path. One or more of the plugs may be surrounded by one or more windings on one or more layers of the substrate. Extension of the plug above an outer surface of the substrate may ensure the integrity of a gap-free connection between the end of the magnetic plug and a mating surface of a magnetic plate, or provide an extension for subsequent processing to reduce the plug to a controlled level of extension, recession, or coplanarity with the PCB outer surfaces.

The paste/slurry may comprise a mixture of powdered magnetic material and a suitable non-magnetic binder. Powdered magnetic material may, e.g., be types CIP-SQ and CIP-SQI carbonyl iron powders, manufactured by BASF SE, Ludwigshafen, Germany, and type ML91S soft ferrite powder, manufactured by Hitachi Metals, Ltd., Japan. Non-magnetic binders may be thermosets, preferably a thermoset polyimide (e.g., types DMI-2550 and DMI-2575 liquid bismaleimide formulations, manufactured by Designer Molecules, Inc., San Diego, CA).

The magnetic properties of plugs will depend on the specific powder used, the granularity of the powder and relative amounts of powder and binder. Powder particle sizes may range from less than 10 microns to 60 microns, 100 microns or larger. It may be advantageous to combine powders of different types and particle sizes. CIP-SQ or CIP-SQI 4.6 micron powder may be combined with 20-60 micron ferrite powder (e.g., type ML91S, produced by Hitachi Metals Ltd.) or combined with other ferromagnetic spherical powder of powder size from 20-60 microns, using any of the thermoset polyimide binders previously described. Powder concentrations may range from 20% CIP-SQ or CIP-SQI to 80% CIP-SQ or CIP-SQI with the remainder being one of the other 20-60 micron powder types. The benefit of combining powder chemistries is that permeability and core loss may be adjusted for best operation over a frequency range. Plugs made using mixed powders have higher permeability than 100% CIP-SQ or 100% CIP-SQI and also have higher permeability than plug legs made from pastes using 100% ferrite of one particle size. Depending on mix ratio and plug dimensions it may be possible to achieve a plug relative permeability in the range of 5 to 40 and saturation flux density greater than 3500 gauss.

Paste/slurries with viscosities between 75,000 and 720,000 centipoise, and preferably between 100,000 and 500,000 centipoise, may be used to fill holes (or slots) with a diameter (or slot width) in the range of 0.5 mm to 2.0 mm (0.020" to 0.080") in PCBs with thicknesses up to 1.25 mm (0.050"). As hole size increases, so too may the fill shrink from hole edges and recessing of plugs during planarization. Planarization may be a limiting factor on feature size and more small apertures may be preferable over fewer large apertures.

Figure 23A:
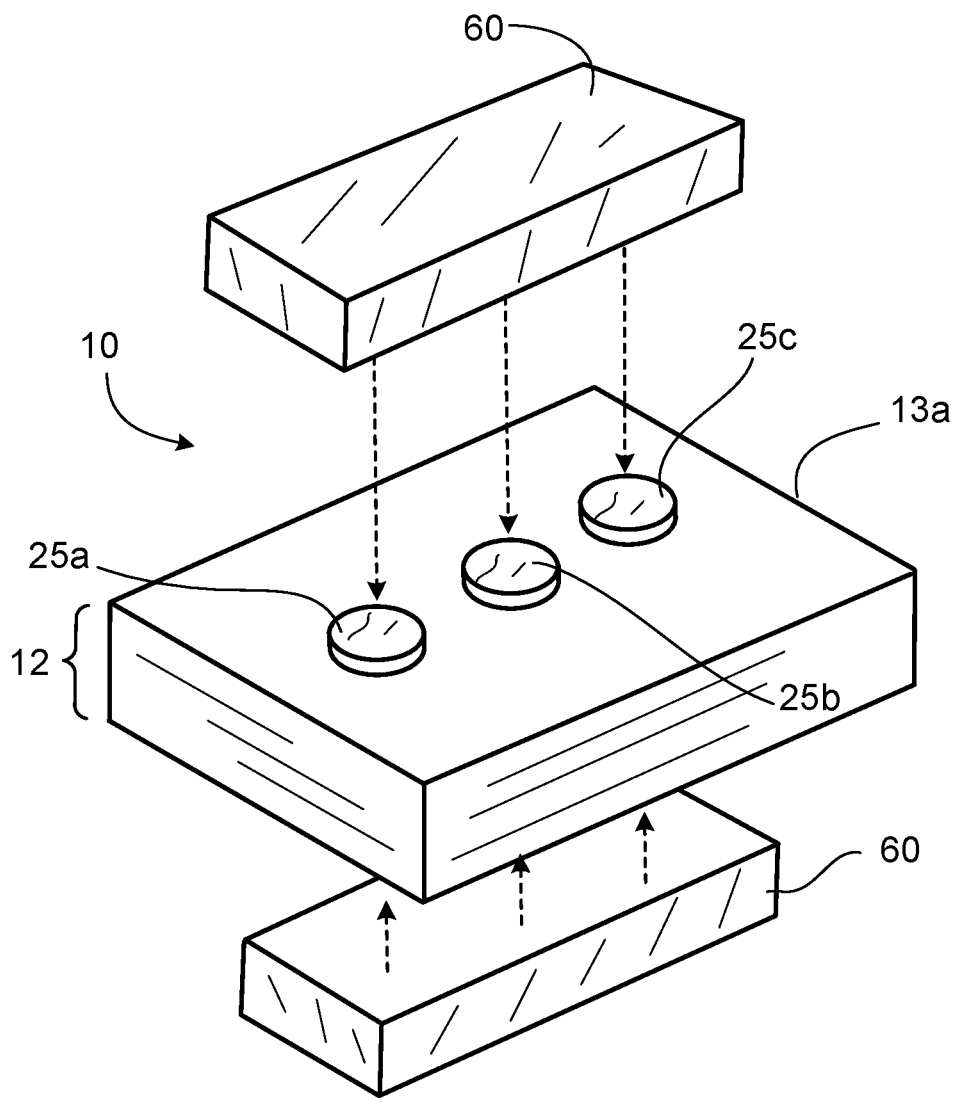
FIG. 23A is an exploded perspective view of a portion of a planar magnetic device according to the invention.
Figure 23B:
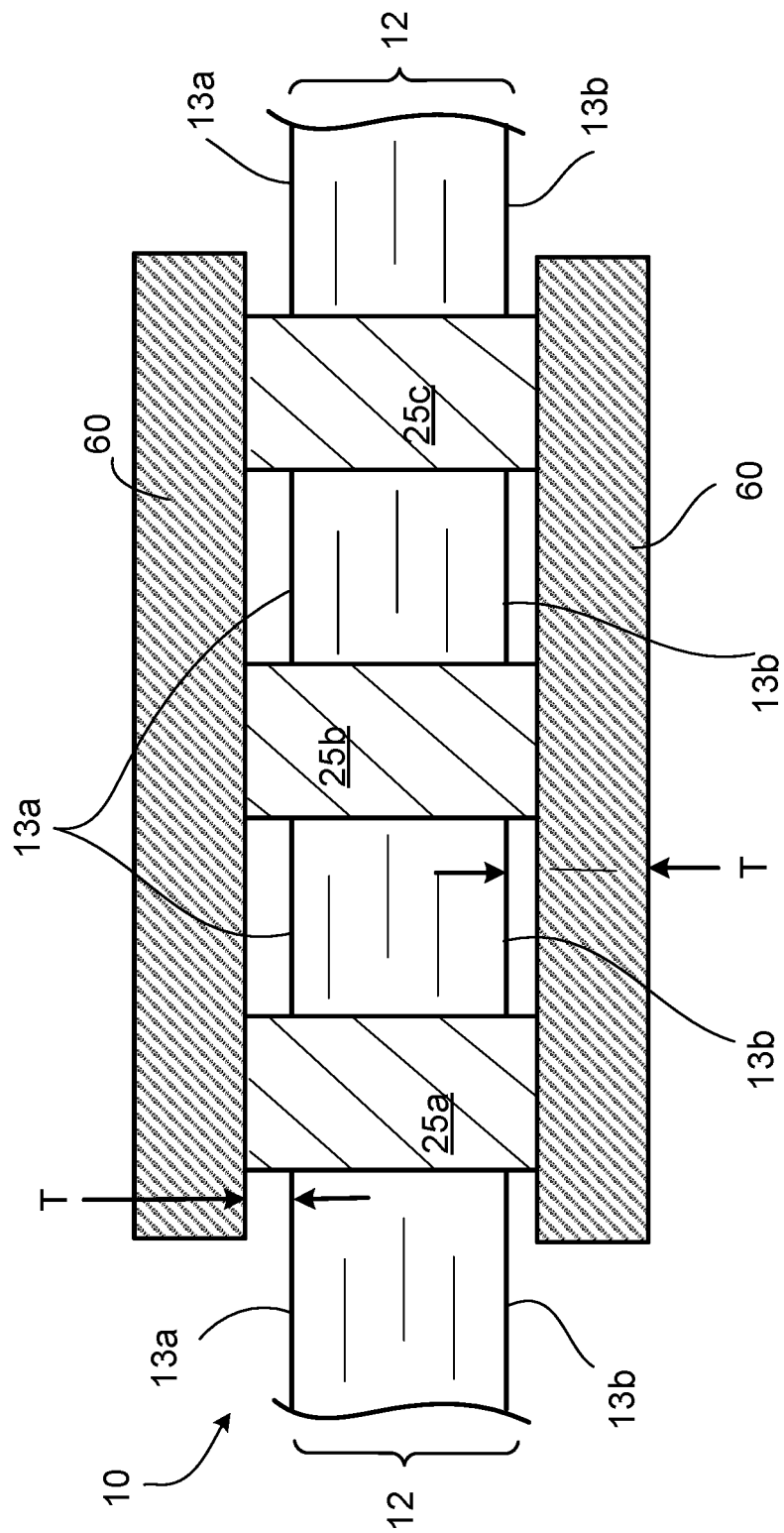
FIG. 23B is a cross-sectional view through the planar magnetic device of FIG. 23A.

Embodiments of the invention may comprise a plurality of core plates and plugs. A pair of top and bottom core plates may span two or more magnetic plugs (e.g., one pair of plates per one pair of plugs as shown in FIGS. 13, 14, and 26A through 26D; one pair of plates per three plugs as shown in FIGS. 23A and 23B). In some applications a single pair of top and bottom core plates may span an array of plugs (e.g., 4, 6, 24 plugs).

A first process for depositing paste/slurry into the apertures may comprise providing a reusable stencil on or over a top surface of the substrate, the stencil comprising openings at locations corresponding to each aperture location in the substrate. Paste/slurry may be deposited over the surface of the stencil by means of a scraper bar that is dragged along the length of the stencil at a substantially constant height above the stencil. The stencil and/or the bar may be made of stainless steel. A flexible runner (e.g. a runner made of silicone rubber) may then be dragged over the surface of the stencil to force paste/slurry into the apertures.

Paste spread thickness may be set by the distance between the scraper bar and the stencil. For small holes and slots, in the dimensional range described above, the separation distance between the scraper bar and the stencil may be in the range of 0.001" to 0.010". Generally, the distance between the spacer bar and the stencil should be greater than the size of the largest particles in the paste to avoid damaging the stencil, e.g. 0.001" distance for a particle size of 5 microns or 0.005" distance for a particle size of 50 microns.

In some applications it may be advantageous to space the stencil away from the surface of the substrate in order to prevent damage to the stencil caused by unintended contact between the spacer bar and stencil resulting from, e.g., imperfections in the flatness of the substrate or stencil or apparatus tolerances. For relatively small substrates (e.g. 4"×8", 10"×12") the likelihood of contact between bar and stencil may be low and it may be unnecessary to provide any separation between the substrate and stencil. For larger panels (e.g. 18"×24" or larger) it may be advantageous to provide a separation of up to 500 micrometers (0.020") between the substrate and the stencil.

The amount of paste/slurry deposited into the holes, and the extension of the paste/slurry above the surfaces of the substrate, may depend upon the substrate thickness, paste spread thickness, the angle of the runner blade relative to the stencil, the thickness of the stencil and the viscosity of the paste/slurry. As discussed above, extension of paste/slurry above both outer surfaces of the substrate may be preferred to allow all plugs to be planarized to a uniform height after curing. Use of a stencil that is too thin may not provide sufficient paste/slurry on the top surface ("top surface underfill"), whereas too thick a stencil may result in excessive paste/slurry on the top surface ("top surface overfill"). Underfill may be more problematic than overfill because the cured plugs may be too short for the specified air gap requirements, requiring additional stencil-printing steps. Overfill, on the other hand may consume excessive paste/slurry increasing cost and could increase the planarization process time. For a 1.25 mm (0.050") thick substrate a stencil thickness in the range of 50 to 150 micrometers (0.002" to 0.006") may be preferable. The stencil thickness may preferably be optimized for each of other substrate thicknesses or applications. Bottom surface underfill was not observed to be a problem. The bottom of the substrate may be supported to prevent flexure, leaving regions around apertures clear to allow paste/slurry to squeeze out of the apertures. A sheet of PCB laminate may be used to support the bottom of the substrate, with holes in the laminate at aperture locations. The angle of the runner relative to the surface of the stencil may affect both the downward pressure that forces paste/slurry into the apertures as well as the extent to which the soft edge of the runner extends into the stencil openings (which, if excessive, may cause top surface underfill). A runner angle, relative to the stencil, in the range of 30° to 90° may be preferred, with optimization for each application, depending on aperture size, orientation, substrate thickness, paste/slurry viscosity, etc. These and other factors (e.g. print speed, which may be dependent upon paste/slurry viscosity) may be determined for particular applications. In some cases, e.g. thick substrates or large apertures, it may be preferable to use multiple print passes, including a first application of paste/slurry, preferably including compression and curing, and followed by a second application of paste/slurry.

Another process for depositing paste/slurry into the apertures may comprise providing a removable mask/stencil on or over a top surface of the substrate, the mask/stencil preferably having uniform thickness and openings at locations corresponding to each aperture location in the substrate. In a process similar to that described above, the paste/slurry may be applied to the top surface and driven into the apertures using a flexible runner. After curing the mask/stencil may be removed.

Modifications of the above methods may be used to recess the plugs to control the effective permeability of the magnetic circuit as discussed above. It may be preferable to start with plugs that have been formed and planarized as described above, followed by an ablation or etch back of the plug ends to form the recesses or air gaps. For example, the ends of the plugs may be laser ablated to form a controlled recess or etched back to a controlled recess using a suitable etchant to either remove the magnetic particles, the binder, or both, preferably followed by cleaning. Alternatively the conductive layers, e.g. copper, on the outer surfaces of the PCB, e.g. may be built up to a controlled thickness by plating preferably after the plugs have been planarized, to increase the thickness of the outer metal layers which may be used beneath the core plates to establish a controlled gap between the core plates and the ends of the plugs. Yet another alternative for forming controlled recesses in the core plugs is to perform the above steps for forming the plugs, preferably including planarization, before the outer layers of the PCB stack are laminated. In other words, after the plugs are formed in the inner layers, the outer insulation and conductive layers may be laminated to one or both sides of the PCB stack resulting a recess equal to either the insulation layer thickness alone (where no copper is left on the surface beneath the core plate), or the combined thickness of the insulation layer and the outer metal layer (where copper remains on the surface beneath the core plate).

The invention has a number of advantages over prior art solutions. Standard PCB processes may be used to build PCBs with embedded magnetic features such as core legs with full utilization of the holes in the PCBs and windings surrounding the holes. For example, tolerance considerations require that solid magnetic legs be made smaller in diameter than the diameter of the holes into which they are inserted, the use of paste/slurry allows complete filling of holes in the PCB, providing more cross-sectional area, lower losses and better performance. Additionally, legs formed with the above described paste/slurry method may exhibit relatively high resistivity compared to solid or sintered ferrite legs, obviating, or at least reducing the need for winding setback and thus decreasing winding resistance and increasing performance, particularly at higher frequencies. Solid magnetic legs may require gapping, whereas proper selection of magnetic powder and the ratio of powder to binder in an inductive device according to the invention may provide a distributed gap that eliminates the need for a gapping step. Furthermore, solid magnetic legs with application-specific magnetic characteristics may require weeks of procurement lead time. The invention enables a virtually limitless variety of paste/slurry combinations, matched precisely to the requirements of a specific application, to be formulated, in real-time, from just a few magnetic powders and binders. Additionally, air or reduce permeability gaps may be set using the methods and features described above further enabling customization of the magnetic circuit properties. The plugs resulting from the above methods and materials may have robust adherence to the PCB preventing unintentional movement within or removal from the holes.

As discussed above, encapsulation material may cover portions of the respective core plate and the outer PCB surface. Technology and examples related to encapsulation are described in, e.g., U.S. Pat. No. 10,537,015, issued Jan. 14, 2020, the entire disclosure of which is incorporated herein by reference.

The invention may provide a significant cost advantage relative to prior approaches. The material cost of solid magnetic legs may be an order of magnitude greater than the cost of the paste/slurry plugs. In addition, the solid legs must be inserted one at a time into the PCB holes and require extensive labor or expensive equipment to do so. The invention allows a large multiplicity of paste/slurry plugs in a PCB to be deposited in a single operation using compatible PCB industry operations.

A number of embodiments of the invention have been described. Nevertheless, it will be understood that various modifications may be made without departing from the spirit and scope of the invention. For example, a hole in the PCB in which a plug is deposited, and the plug deposited into the hole, may be round, as described above, or they may be any other shape. Holes may pass entirely through the PCB, as described above, or they may pass partially into the PCB (e.g., to form a gap in a magnetic path passing through the PCB). Conductive or non-conductive spacers surrounding holes (e.g., conductive spacer 40, FIG. 13; non-conductive spacer 42, FIG. 19) may also be of any shape. Although the description refers to a PCB comprising un-patterned top and bottom conductive layers, it is understood that other features may be used as spacers extending above the surface of the PCB (e.g. as illustrated by the dimension T in FIG. 10B) in the regions around the locations of the holes. For example, the conductive spacers may be electrically connected, e.g. using conductive vias to connect to other conductive layers, to form a turn of a winding (a "spacer turn"), e.g. connecting a spacer turn in parallel with another turn may reduce winding resistance. Connections to the spacer turn may preferably be made at each end of the interrupted ring, e.g. near the notch, and if connected to another winding or other conductive features preferably avoids formation of a shorted turn around the hole or holes. The spacer turn may alternatively be used to sense flux in the magnetic core, etc. In some embodiments the inductive component may be a stand-alone inductor or transformer for inclusion into another electronic assembly. For such embodiments there may be no need for the step of assembling additional circuit components onto the top and bottom layers of the PCB.

As used herein, the terms magnetically permeable material, magnetically permeable particle, magnetically permeable powder and magnetic paste or slurry refer to materials having a relative permeability greater than 2.

What is claimed is:

1. A method of making a planar inductive device comprising the steps of:
   providing a generally planar substrate having a plurality of conductive layers, the planar substrate having a top outer surface and a bottom outer surface;
   providing a plurality of spacers, in which each spacer lies upon and extends a substantially uniform distance, T, from the top outer surface or the bottom outer surface of the planar substrate, and wherein at least one spacer is separated from another spacer;
   for each of the spacers, forming an aperture in the spacer and the substrate adjacent to the spacer, wherein the conductive layers of the substrate comprise a conductive feature that aligns with the aperture and forms a winding around the aperture;
   depositing a malleable magnetically permeable material into each of the apertures;
   curing the malleable magnetic material to form a solid plug within each of the apertures; and
   etching material on the planar substrate, and using the plurality of spacers to protect ends of the solid plugs from effects of the etching.

2. The method of claim 1 wherein:
   the step of depositing comprises delivering a volume of malleable magnetic material into each aperture to fill the aperture and extend outside of the aperture; and
   the method further comprises:
      partially curing the malleable magnetic material; and
      compressing the partially cured magnetic material into the aperture.

3. The method of claim 2, further comprising the step of:
   planarizing the device to make an end surface of the plug coplanar with the extension of the corresponding spacer and parallel to the top outer surface or the bottom outer surface.

4. The method of claim 3 wherein the device comprises two or more plugs, each plug passing through a first spacer on the top outer surface and a second spacer on the bottom outer surface, and
   the step of planarization comprises: planarizing the top and bottom of the device to make the end surfaces of the plugs parallel to, and coplanar with the extension of the corresponding spacer or spacers on, their respective outer surface.

5. The method of claim 4, further comprising the step of:
   providing a pair of core pieces, one located on the top outer surface and the other located on the bottom outer surface, the core pieces forming a flux path for directing flux through a pair of plugs.

6. The method of claim 5 wherein no gap is provided between a core piece and the ends of the pair of plugs spanned by the core piece.

7. The method of claim 5 wherein a gap is provided between a core piece and the ends of the pair of plugs spanned by the core piece.

8. The method of claim 3 wherein planarizing comprises lapping.

9. The method of claim 3 wherein planarizing comprises sanding.

10. The method of claim 2 wherein compressing the partially cured malleable magnetically permeable material comprises compressing under a full or partial vacuum.

11. The method of claim 2 wherein delivering malleable magnetically permeable material comprises delivering under a full or partial vacuum.

12. The method of claim 2 wherein compressing into the aperture comprises pressing the substrate between planar plates.

13. The method of claim 12, further comprising:
   providing a non-stick planar surface on the surfaces of the planar plates to prevent the plug material from adhering to the plates.

14. The method of claim 13 wherein the non-stick planar surface comprises polytetrafluoroethylene (PTFE).

15. The method of claim 1 wherein the malleable magnetically permeable material comprises a heat-curable binder, and the step of curing comprises heating the substrate.

16. The method of claim 15, wherein the binder is a thermoset.

17. The method of claim 1 wherein the planar substrate comprises a multilayer printed circuit board (PCB).

18. The method of claim 1 wherein providing the spacers comprises providing a conductive feature on the top outer surface or the bottom outer surface of the substrate.

19. The method of claim 1 wherein providing the spacers comprises providing a non-conductive feature on the top outer surface or the bottom outer surface of the substrate.

20. The method of claim 19 wherein providing a non-conductive feature on the top outer surface or the bottom outer surface comprises depositing a non-conductive material onto the top outer surface or the bottom outer surface.

21. The method of claim 1, wherein the malleable magnetically permeable material comprises a magnetically permeable powder comprising magnetically permeable particles.

22. The method of claim 21 wherein the magnetically permeable powder comprises a carbonyl iron powder.

23. The method of claim 22 wherein the powder comprises a mixture of magnetically permeable powders.

24. The method of claim 22 wherein the powder has an average particle size less than 10 microns.

25. The method of claim 22 wherein the relative permeability of the magnetically permeable material is greater than 2.

26. The method of claim 22 wherein the relative permeability of the solid plug within each of the apertures is between 5 and 40.

27. The method of claim 1 wherein each spacer is separated from other spacers.

28. The method of claim 1, wherein the planar substrate comprises at least one of a top conductive layer or a bottom conductive layer,
wherein each solid plug comprises an end that is near the top conductive layer or the bottom conductive layer of the planar substrate,
wherein the method comprises etching the at least one of the top conductive layer or the bottom conductive layer of the planar substrate to form at least one of a top circuit pattern or a bottom circuit pattern on the planar substrate, and
wherein the method comprises protecting, using each of the spacers, an end of the corresponding solid plug from the etching.

29. The method of claim 1 wherein at least one of the spacers comprises a ring spacer.

30. The method of claim 29 wherein each of the spacers comprises a ring spacer.

31. The method of claim 21 wherein the powder has an average particle size less than 10 microns.

32. The method of claim 21 wherein the powder has an average particle size between 10 microns and 100 microns.

33. The method of claim 21 wherein the powder has an average particle size greater than 100 microns.

34. The method of claim 1 wherein forming an aperture comprises drilling.

35. The method of claim 1 wherein forming an aperture comprises punching.

36. The method of claim 1 wherein forming an aperture comprises routing.

37. The method of claim 1 wherein forming an aperture comprises laser machining.

38. The method of claim 21 wherein the magnetically permeable powder comprises a ferrite powder.

39. The method of claim 21 wherein the magnetically permeable powder comprises a powdered oxide of silicon.

40. The method of claim 21 wherein the powder comprises a mixture of magnetically permeable powders.

41. The method of claim 40 wherein the mixture of powders comprises carbonyl iron powder and ferrite powder.

42. The method of claim 1 wherein the planar substrate comprises a conductive material on the top outer surface or the bottom outer surface, and providing the plurality of spacers comprises for each of at least some of the spacers, removing a portion of the conductive material.

43. The method of claim 42 wherein removing a portion of the conductive material comprises:
masking the conductive material at the location of the spacer; and
removing conductive material from unmasked portions of the conductive layer.

44. The method of claim 43 further comprising:
masking an exposed end of the solid plug within each of at least some of the apertures.

45. The method of claim 42 wherein providing the plurality of spacers further comprises:
for each of at least some of the spacers, configuring a feature in the conductive material to prevent the spacer from forming an uninterrupted conductive ring around the aperture.

46. The method of claim 45 wherein the feature is provided prior to removing a portion of the conductive material.

47. The method of claim 45 wherein the feature comprises a notch.

48. The method of claim 45, further comprising depositing a non-conductive protective material into the feature.

49. The method of claim 42 wherein removing a portion of the conductive material comprises:
providing a mask outside of a spacer region, the spacer region overlapping and surrounding an aperture location;
removing conductive material from the spacer region; and
depositing a non-conductive spacer material in the spacer region.

50. The method of claim 49 wherein forming the aperture comprises configuring the aperture within the spacer region.

51. The method of claim 49 wherein removing conductive material comprises chemical etching.

52. The method of claim 42 wherein removing conductive material comprises chemical etching.

53. The method of claim 1 wherein the depositing malleable magnetically permeable material comprises:
locating a stencil over the top outer surface or the bottom outer surface of the substrate; and
moving the malleable magnetically permeable material through an opening in the stencil.

54. The method of claim 53 wherein depositing malleable magnetically permeable material comprises spreading paste or slurry over the stencil and using a flexible runner to force paste or slurry into the apertures.

55. The method of claim 53 wherein depositing malleable magnetically permeable material comprises injecting malleable magnetically permeable material into the apertures.

56. The method of claim 1 wherein forming an aperture comprises forming an aperture that passes all the way through the substrate.

57. The method of claim 1 wherein the malleable magnetically permeable material comprises a paste or slurry having a viscosity in the range of 75,000 to 720,000 centipoise.

58. The method of claim 57 wherein the paste or slurry comprises a magnetically permeable material and a liquid binder.

59. A method comprising:
providing a generally planar substrate having a plurality of conductive layers, the planar substrate having a top outer surface and a bottom outer surface;
providing a plurality of spacers on at least one of the outer surfaces, wherein each of the spacers extend a predetermined distance, T, above the at least one outer surface, and wherein at least one spacer is separated from another spacer;
depositing a malleable magnetically permeable material into one or more apertures in the substrate at least to the height of the plurality of spacers, the malleable magnetically permeable material comprising a magnetic paste or slurry comprising a magnetically permeable material and a liquid binder, and wherein the conductive layers of the substrate comprise conductive features in which each conductive feature aligns with an aperture and forms a winding around the aperture;
at least partially curing the magnetic paste or slurry to form solid plugs; and
etching material on the planar substrate, and using the plurality of spacers to protect ends of the solid plugs from effects of the etching.

60. The method of claim 59 wherein:
at least one of the plurality of spacers is provided at the one or more apertures, the at least one of the plurality of spacers surrounding a circumference or circumferences of the one or more apertures; and
the depositing is performed through one or more openings in the spacer that correspond to the one or more apertures.

61. The method of claim 60 wherein the providing a plurality of spacers further comprises:
providing a material of substantially uniform height at a location or locations for the one or more apertures, the material covering the location or locations of the one or more apertures; and
forming one or more apertures in the material at the location or locations of the one or more apertures.

62. The method of claim 61 wherein the forming one or more apertures in the material at the location or locations of the one or more apertures produces the one or more apertures in the substrate.

63. The method of claim 61 wherein providing a material of substantially uniform height comprises providing a conductive layer.

64. The method of claim 59, further comprising compressing the at least partially cured magnetic paste or slurry in the one or more apertures.

65. The method of claim 64 further comprising fully curing the magnetic paste or slurry.

66. The method of claim 59, wherein the step of depositing further comprises:
delivering the paste or slurry into the one or more apertures in a sufficient quantity to fill the one or more apertures and a volume outside each of the one or more apertures; and
compressing the at least partially cured paste or slurry into the aperture to form a plug within the aperture.

67. The method of claim 66 wherein the spacers are provided on both of the outer surfaces.

68. The method of claim 67, further comprising the step of:
providing a pair of magnetically permeable core pieces, one located on the top outer surface and the other located on the bottom outer surface, the core pieces forming a flux path for directing flux through the cured magnetic paste or slurry in at least two apertures.

69. The method of claim 59, further comprising removing at least one of the spacers after the magnetic paste or slurry is at least partially cured.

70. The method of claim 59 wherein at least one of the spacers comprises a metallic layer on the top or bottom outer surface of the substrate.

71. The method of claim 70 wherein the metallic layer is patterned to form an interrupted ring around the one or more apertures.

72. The method of claim 71, further comprising
mounting magnetically permeable core pieces to the top outer surface and to the bottom outer surface of the substrate, the core pieces forming a magnetic circuit with the cured magnetic paste or slurry in at least two of the one or more filled apertures.

73. The method of claim 72, further comprising attaching electronic components to the substrate, the electronic components being electrically connected to one or more conductive windings formed in metallic layers in the substrate around one or more of the filled apertures.

74. The method of claim 73 wherein the electronic components and magnetic circuit form a switching power converter having an input and an output, and
wherein the electronic components are adapted to convert power received from the input for delivery to the output.

75. The method of claim 59 wherein each spacer is separated from other spacers.

76. The method of claim 59 wherein at least one of the spacers comprises a ring spacer.

77. The method of claim 76 wherein each of the spacers comprises a ring spacer.

78. A method of making a power converter with a planar inductive device, the method comprising the steps of:
providing a printed circuit board ("PCB") having a plurality of conductive layers, the PCB having a top outer surface and a bottom outer surface;
providing a plurality of spacers, in which each spacer lies upon and extends a substantially uniform distance, T, from the top outer surface or the bottom outer surface of the PCB, wherein multiple spacers are provided on a same outer surface and are separated from one another;
for each of the spacers, forming an aperture in the spacer and the substrate adjacent to the spacer;
depositing a malleable magnetically permeable material into each of the apertures, including delivering a volume of malleable magnetic material into each aperture to fill the aperture and extend outside of the aperture;
partially curing the malleable magnetic material;
compressing the partially cured magnetic material into the aperture;
curing the malleable magnetic material to form a solid plug within each of the apertures;

planarizing the device to make an end surface of the plug coplanar with the extension of the spacer and parallel to the top outer surface or the bottom outer surface;

assembling one or more electronic components onto at least one of the top outer surface or the bottom outer surface of the PCB; and encapsulating at least one of the top outer surface or the bottom outer surface of the PCB, and corresponding one or more electronic components assembled thereon, with encapsulation material;

wherein the planar inductive device includes at least one winding coupled to one or more magnetically permeable core legs;

wherein each winding comprises one or more conductive features formed in one or more of the conductive layers of the PCB;

wherein each magnetically permeable core leg comprises one or more of the solid plugs; and wherein the electronic components are electrically connected to the at least one winding.

79. The method of claim 78 wherein the spacers are formed on the top and bottom outer surfaces, the apertures extend completely through the PCB, each plug passes through a first spacer on the top outer surface and a second spacer on the bottom outer surface, and the top and bottom of the device are planarized to make the end surfaces of the plugs parallel to, and coplanar with the extension of the spacer on, their respective outer surface.

80. The method of claim 79, further comprising the step of:
providing a pair of core pieces, one located on the top outer surface and the other located on the bottom outer surface, the core pieces forming a flux path for directing flux through a pair of plugs.

81. The method of claim 78, comprising etching material on the printed circuit board, and using the plurality of spacers to protect ends of the solid plugs from effects of the etching.

82. The method of claim 81 wherein the printed circuit board comprises at least one of a top conductive layer or a bottom conductive layer,
wherein each solid plug comprises an end that is near the top conductive layer or the bottom conductive layer of the printed circuit board,
wherein the method comprises etching the at least one of the top conductive layer or the bottom conductive layer of the printed circuit board to form at least one of a top circuit pattern or a bottom circuit pattern on the printed circuit board, and
wherein the method comprises protecting, using each of the spacers, an end of the corresponding solid plug from the etching.

83. The method of claim 78 wherein the malleable magnetically permeable material comprises a magnetic paste or slurry comprising a magnetically permeable material and a liquid binder;
wherein a corresponding spacer surrounds a circumference of each aperture, and the depositing is performed through openings in the spacers that correspond to the apertures;
wherein the providing a plurality of spacers further comprises:
providing a material of substantially uniform height at locations for the apertures, the material covering the locations of the apertures; and
forming apertures in the material at the locations of the apertures.

84. The method of claim 83, wherein the step of depositing further comprises:
delivering the paste or slurry into the apertures in a sufficient quantity to fill the apertures and a volume outside each of the apertures; and
compressing the at least partially cured paste or slurry into the apertures to form plugs within the apertures.

85. The method of claim 83, further comprising removing at least one of the spacers after the magnetic paste or slurry is at least partially cured.

86. The method of claim 83 wherein at least one of the spacers comprises a metallic layer on the top or bottom outer surface of the substrate.

87. The method of claim 86 wherein the metallic layer is patterned to form an interrupted ring around at least one of the apertures.

88. The method of claim 87, further comprising
mounting magnetically permeable core pieces to the top outer surface and to the bottom outer surface of the substrate, the core pieces forming a magnetic circuit with the cured magnetic paste or slurry in at least two of the filled apertures.

89. The method of claim 88, further comprising attaching electronic components to the substrate, the electronic components being electrically connected to one or more conductive windings formed in metallic layers in the substrate around one or more of the filled apertures.

90. The method of claim 89 wherein the electronic components and magnetic circuit form a switching power converter having an input and an output, and
wherein the electronic components are adapted to convert power received from the input for delivery to the output.

91. A method of making a power converter, the method comprising:
providing a multilayer printed circuit board ("PCB") having a top outer surface and a bottom outer surface, a plurality of conductive layers, a plurality of conductive features, one or more conductive windings formed in the conductive layers, and a plurality of apertures, each aperture being aligned with a respective conductive winding;
forming magnetically permeable core legs in the apertures in the PCB including the steps of:
(a) providing a plurality of spacers, each spacer surrounding a circumference of each aperture, each spacer being disposed on and extending a substantially uniform distance, T, from a respective outer surface of the PCB, each spacer being separated from adjacent spacers on the respective outer surface;
(b) depositing a malleable magnetically permeable material into the apertures in the PCB at least to the height of the plurality of spacers, the malleable magnetically permeable material comprising a magnetic paste or slurry comprising a magnetically permeable material and a liquid binder; and
(c) at least partially curing the magnetic paste or slurry;
assembling electronic components onto the top or bottom outer surface of the PCB or both, wherein the conductive features electrically connect the electronic components to the one or more conductive windings to form switching power conversion circuitry; and
encapsulating at least one of the top outer surface or the bottom outer surface, or both, of the PCB, and corresponding one or more electronic components assembled thereon, with encapsulation material.

92. The method of claim 91, further comprising
mounting one or more magnetically permeable core pieces to the top outer surface, the bottom outer surface, or both, the core pieces forming a magnetic circuit with respective ones of the magnetically permeable core legs.

93. The method of claim 91, comprising etching material on the printed circuit board, and using the plurality of spacers to protect ends of the solid plugs from effects of the etching.

94. The method of claim 93 wherein the printed circuit board comprises at least one of a top conductive layer or a bottom conductive layer,
wherein each solid plug comprises an end that is near the top conductive layer or the bottom conductive layer of the printed circuit board,
wherein the method comprises etching the at least one of the top conductive layer or the bottom conductive layer of the printed circuit board to form at least one of a top circuit pattern or a bottom circuit pattern on the printed circuit board, and
wherein the method comprises protecting, using each of the spacers, an end of the corresponding solid plug from the etching.

95. The method of claim 91 wherein the encapsulating comprises forming an encapsulated top outer surface and an encapsulated bottom outer surface;
wherein the method further comprises forming conductive terminations along at least one of the encapsulated top outer surface or the encapsulated bottom outer surface for surface mount soldering to another device.

96. The method of claim 95 wherein forming conductive terminations comprises forming conductive terminations along the encapsulated top outer surface and the encapsulated bottom outer surface for surface mount soldering to other devices.

97. The method of claim 95 wherein the one or more conductive windings comprise at least one primary winding and at least one secondary winding.

98. The method of claim 97 wherein the at least one primary winding is electrically connected to some of the conductive terminations for receiving input power;
wherein the at least one secondary winding is electrically connected to some of the conductive terminations for providing output power.

99. The method of claim 91 wherein assembling the electronic components comprises assembling a plurality of switches onto the top or bottom outer surface of the PCB or both;
wherein forming the switching power conversion circuitry comprises forming a transformer circuit and a rectification circuit; and
wherein the transformer circuit comprises the one or more conductive windings, and the rectification circuit comprises the plurality of switches.

100. The method of claim 99 wherein the plurality of switches comprise secondary switches that function as controlled rectifiers;
wherein assembling the electronic components comprises assembling a switch driver onto the top or bottom outer surface of the PCB, and the switch driver is configured to control operation of the secondary switches.

* * * * *

UNITED STATES PATENT AND TRADEMARK OFFICE
CERTIFICATE OF CORRECTION

PATENT NO. : 12,336,118 B1
APPLICATION NO. : 16/878263
DATED : June 17, 2025
INVENTOR(S) : Patrick R. Lavery, Jeffrey John LeBlanc and Patrizio Vinciarelli It is certified that error appears in the above-identified patent and that said Letters Patent is hereby corrected as shown below:

In the Specification

Column 1, Line 7, delete "applications" and insert -- application --

Column 1, Line 28, delete "herein)" and insert -- herein --

Column 9, Line 62, delete "3." and insert -- 3 --

Column 11, Line 59, delete "e g." and insert -- e.g. --

Column 12, Line 34, after "according" insert -- to --

Column 16, Line 28, delete "permeability." and insert -- permeability, --

Column 16, Line 33, delete "expression," and insert -- expression; --

Column 16, Line 42, delete "plug." and insert -- plug, --

Column 16, Line 62, delete "1%." and insert -- 1%, --

Signed and Sealed this
Twenty-fifth Day of November, 2025

John A. Squires
*Director of the United States Patent and Trademark Office*